(12) United States Patent
Iwata et al.

(10) Patent No.: US 10,196,526 B2
(45) Date of Patent: Feb. 5, 2019

(54) TRANSPARENT CONDUCTIVE FILM, INFORMATION INPUT DEVICE, AND ELECTRONIC DEVICE

(75) Inventors: Ryosuke Iwata, Tokyo (JP); Mikihisa Mizuno, Tokyo (JP)

(73) Assignee: DEXERIALS CORPORATION, Tokyo (JP)

( * ) Notice: Subject to any disclaimer, the term of this patent is extended or adjusted under 35 U.S.C. 154(b) by 0 days.

(21) Appl. No.: 13/876,279

(22) PCT Filed: Jul. 12, 2011

(86) PCT No.: PCT/JP2011/066287
§ 371 (c)(1),
(2), (4) Date: Apr. 18, 2013

(87) PCT Pub. No.: WO2012/114552
PCT Pub. Date: Aug. 30, 2012

(65) Prior Publication Data
US 2013/0258568 A1    Oct. 3, 2013

(30) Foreign Application Priority Data

Feb. 23, 2011   (JP) ................................. 2011-037418

(51) Int. Cl.
*C09D 5/24*    (2006.01)
*H01B 1/22*    (2006.01)
(Continued)

(52) U.S. Cl.
CPC .............. *C09D 5/24* (2013.01); *G06F 3/041* (2013.01); *H01B 1/04* (2013.01); *H01B 1/22* (2013.01);
(Continued)

(58) Field of Classification Search
CPC .. H01G 9/2031; H01G 9/2059; H01G 9/2063; H01L 31/022466; H01L 31/1884;
(Continued)

(56) References Cited

U.S. PATENT DOCUMENTS 5,684,069 A * 11/1997 Auslander ...................... 524/88
7,588,827 B2    9/2009 Nie et al.
(Continued)

FOREIGN PATENT DOCUMENTS

CN    1482686 A    3/2004
CN    1709171 A    12/2005
(Continued)

OTHER PUBLICATIONS

Aug. 27, 2013 International Preliminary Report on Patentability issued in International Patent Application No. PCT/JP2011/066287 (with translation).

(Continued)

*Primary Examiner* — Chinessa T. Golden
(74) *Attorney, Agent, or Firm* — Oliff PLC

(57) ABSTRACT

A transparent conductive film including metal nanowires and a colored compound adsorbed by the metal nanowires is provided. The metal nanowires are a material which absorbs light in the visible light region, and also each has a functional group which is bound to a metal constituting the metal nanowire.

14 Claims, 10 Drawing Sheets

(51) Int. Cl.
    *H01L 27/32* (2006.01)
    *H01L 51/52* (2006.01)
    *G06F 3/041* (2006.01)
    *H01B 1/04* (2006.01)
    *H05K 7/00* (2006.01)
    *H01B 13/32* (2006.01)
    *H01L 33/42* (2010.01)

(52) U.S. Cl.
    CPC ......... *H01B 13/322* (2013.01); *H01L 27/322* (2013.01); *H01L 51/5206* (2013.01); *H01L 51/5234* (2013.01); *H05K 7/00* (2013.01); *G06F 2203/04103* (2013.01); *H01L 33/42* (2013.01); *H01L 2251/5369* (2013.01)

(58) Field of Classification Search
    CPC ............... H01L 27/322; H01L 51/5206; H01L 51/5234; H01L 33/42; H01L 2251/5369; H05K 9/009; H05K 9/0092; H05K 7/00; B32B 15/02; B22F 1/0025; C09D 5/24; G06F 3/041; G06F 2203/040103; H01B 1/04; H01B 1/22; H01B 13/322
    USPC ........................................................ 428/297.4
    See application file for complete search history.

(56) References Cited

U.S. PATENT DOCUMENTS

| | | | |
|---|---|---|---|
| 7,960,027 B2 | 6/2011 | Guiheen et al. | |
| 7,964,790 B2 | 6/2011 | Jung et al. | |
| 7,967,872 B2 | 6/2011 | Daubresse et al. | |
| 8,038,732 B2 | 10/2011 | Greaves et al. | |
| 8,049,333 B2 | 11/2011 | Alden et al. | |
| 8,052,773 B2 * | 11/2011 | Takada | 75/371 |
| 8,398,722 B2 | 3/2013 | Greaves et al. | |
| 8,471,457 B2 * | 6/2013 | Yamamoto | 313/503 |
| 2003/0030037 A1 | 2/2003 | Takamiya et al. | |
| 2003/0100235 A1 * | 5/2003 | Kittler, Jr. | 442/117 |
| 2004/0021758 A1 | 2/2004 | Miyazaki et al. | |
| 2006/0215250 A1 | 9/2006 | Shibuya et al. | |
| 2006/0252065 A1 | 11/2006 | Zhao et al. | |
| 2007/0085051 A1 * | 4/2007 | Sohn et al. | 252/62.2 |
| 2007/0089783 A1 * | 4/2007 | Jung et al. | 136/263 |
| 2008/0143906 A1 * | 6/2008 | Allemand et al. | 349/43 |
| 2008/0203901 A1 * | 8/2008 | Bukesov | C09K 11/02 313/503 |
| 2008/0259262 A1 * | 10/2008 | Jones | B82Y 10/00 349/139 |
| 2009/0056589 A1 | 3/2009 | Guiheen et al. | |
| 2009/0130433 A1 | 5/2009 | Takada | |
| 2009/0166055 A1 | 7/2009 | Guiheen et al. | |
| 2009/0189124 A1 | 7/2009 | Guiheen et al. | |
| 2010/0212737 A1 | 8/2010 | Fuhrmann et al. | |
| 2010/0243295 A1 | 9/2010 | Allemand et al. | |
| 2010/0295446 A1 | 11/2010 | Yamamoto | |
| 2010/0300529 A1 * | 12/2010 | Kawahara | H01G 9/2031 136/256 |
| 2011/0094651 A1 | 4/2011 | Kuriki | |
| 2012/0103660 A1 | 5/2012 | Gupta et al. | |
| 2012/0118617 A1 | 5/2012 | Bories-Azeau et al. | |
| 2012/0266392 A1 | 10/2012 | Greaves et al. | |
| 2013/0258568 A1 | 10/2013 | Iwata et al. | |

FOREIGN PATENT DOCUMENTS

| | | |
|---|---|---|
| CN | 103493151 A | 1/2014 |
| EP | 1311001 A1 | 5/2003 |
| EP | 2 615 528 A1 | 7/2013 |
| EP | 2 821 316 A1 | 1/2015 |
| JP | H03012465 A | 1/1991 |
| JP | H05295283 A | 11/1993 |
| JP | H11305375 A | 11/1999 |
| JP | 2003292477 A | 10/2003 |
| JP | A-2005-038625 | 2/2005 |
| JP | 2006-127929 A | 5/2006 |
| JP | 2009129732 A | 6/2009 |
| JP | A-2009-120867 | 6/2009 |
| JP | A-2009-127092 | 6/2009 |
| JP | 2009146747 A | 7/2009 |
| JP | 2009534474 A | 9/2009 |
| JP | 2009536671 A | 10/2009 |
| JP | A-2010-507199 | 3/2010 |
| JP | A-2010-525526 | 7/2010 |
| JP | A-2010-525527 | 7/2010 |
| JP | 2010-539250 A | 12/2010 |
| JP | 2010539260 A | 12/2010 |
| JP | 2010539315 A | 12/2010 |
| JP | A-2011-070820 | 4/2011 |
| JP | 2011108425 A | 6/2011 |
| JP | 2011-233468 A | 11/2011 |
| JP | 2012-008255 A | 1/2012 |
| JP | 4862969 B1 | 1/2012 |
| JP | 2012009383 A | 1/2012 |
| JP | 4893867 B1 | 3/2012 |
| JP | 2012185770 A | 9/2012 |
| JP | 2012-190777 A | 10/2012 |
| JP | 2012190780 A | 10/2012 |
| JP | 2013008231 A | 1/2013 |
| JP | 2013054609 A | 3/2013 |
| JP | 2013211130 A | 10/2013 |
| JP | 2013214507 A | 10/2013 |
| WO | 97/48107 A1 | 12/1997 |
| WO | 2007/110534 A2 | 10/2007 |
| WO | 2008/046058 A3 | 10/2008 |
| WO | 2008/149835 A1 | 12/2008 |
| WO | WO 2008/147431 A2 | 12/2008 |
| WO | 2009/034059 A2 | 3/2009 |
| WO | 2009/037324 A2 | 3/2009 |
| WO | 2009/054273 A1 | 4/2009 |
| WO | 2009/107694 A1 | 9/2009 |
| WO | WO 2011/078170 A1 | 6/2011 |
| WO | 2011/097470 A2 | 8/2011 |
| WO | 2011/114846 A1 | 9/2011 |
| WO | 2013/047197 A1 | 4/2013 |

OTHER PUBLICATIONS

Andrew et al; "Functionalised Silver Nanowire Structures;" Journal of Physics: Conference Series; 2007; vol. 61; pp. 36-40.
Aug. 12, 2013 Search Report issued in European Patent Application No. EP 11859528.9.
Hu et al., "Scalable Coating and Properties of Transparent, Flexible, Silver Nanowire Electrodes," American Chemical Society, Apr. 2010, vol. 5, pp. 2955-2963.
Aug. 16, 2011 International Search Report issued in International Application No. PCT/JP2011/066287.
Aug. 16, 2011 Written Opinion issued in International Application No. PCT/JP2011/066287; with English-language translation.
Apr. 3, 2015 Office Action issued in Chinese Patent Application No. 201180068414.2.
May 15, 2015 Office Action issued in European Application No. 11 859 528.9.
"Lubrizol Solsperse super dispersant", May 6, 2015, XP055187833, Retrieved from the Internet: URL:http://shanghaikaikaichemical.imould.com/product-55317-Lubrizol+Solsperse+super+dispersant.htm.
Nov. 25, 2015 Office Action issued in European Patent Application No. 11859528.9.
Apr. 27, 2016 U.S. Office Action issued in U.S. Appl. No. 14/593,185.
Nov. 4, 2015 Office Action issued in Chinese Patent Application No. 201180068414.2.
Aug. 5, 2016 Office Action issued in U.S. Appl. No. 14/593,185.
Jul. 29, 2016 Office Action issued in Chinese Patent Application No. 201180068414.2.
Mar. 18, 2016 Office Action issued in Chinese Patent Application No. 201180068414.2.
Dec. 8, 2015 Office Action issued in Chinese Patent Application No. 201380012809.X.

(56) References Cited

OTHER PUBLICATIONS

Mar. 21, 2016 Office Action issued in Korean Patent Application No. 10-2014-7021438.
Jul. 27, 2016 Office Action issued in Chinese Patent Application No. 201380012809.X.
Sep. 21, 2016 Office Action issued in Korean Patent Application No. 10-2014-7021438.
Oct. 11, 2016 Office Action issued in Japanese Patent Application No. 2013-042961.
Mar. 3, 2017 Office Action issued in U.S. Appl. No. 14/382,078.
Feb. 3, 2017 Office Action issued in Chinese Patent Application No. 201380012809.X.
Dec. 23, 2015 Office Action issued in Chinese Patent Application No. 201380012649.9.
Mar. 21, 2016 Office Action issued in Korean Patent Application No. 10-2014-7021439.
Jul. 26, 2016 Office Action issued in Chinese Patent Application No. 201380012649.9.
Oct. 18, 2016 Office Action issued in Japanese Patent Application No. JP2013-042844.
Feb. 17, 2017 Office Action Issued in U.S. Appl. No. 14/382,288.
Vargas-Baca et al., Linear and nonlinear optical responses of a dye anchored to gold nanoparticles dispersed in liquid and polymeric matrixes, Can. J. Chem., vol. 80, 2002, pp. 1625-1633.
Moula et al., Plasmon-Enhanced Resonance Raman Scattering and flourescence in langmuir-Blodgett Monolayer, Analytical Chemistry, vol. No. 1, Jan. 1, 2011, pp. 284-288.
Daniel et al., Gold Nanoparticles: Assembly, Supramolecular Chemistry, Quantam-Size Related Properties, and Applications toward Biology, Catalysis, and Nanotechnology, Chemical Reviews, 2004, vol. 104, pp. 293-346.
Dec. 23, 2016 Office Action issued in Taiwanese Patent Application No. 102108145.
May 28, 2013 International Search Report issued in International Patent Application No. PCT/JP2013/056026.
May 30, 2017 Office Action Issued in Japanese Patent Application No. 2013-042844.
Chung et al., The surface modification of silver nanoparticies by phosphoryl disulfides for improved biocompatibility and intracellular uptake, Feb. 19, 2008, Biomaterials 29 (2008) pp. 1807-1816.
May 28, 2013 International Search Report issued in International Patent Application No. PCT/JP2013/055999.
Jun. 10, 2014 International Search Report issued in International Patent Application No. PCT/JP2014/060235.
Oct. 27, 2015 Notification of Reasons for Refusal issued by the Japan Patent Office in the corresponding Japanese Patent Application No. 2013-145834.
Sep. 20, 2016 Decision of Refusal issued by the Japan Patent Office in the corresponding Japanese Patent Application No. 2013-145834.
Oct. 8, 2016, Office Action issued by the State Intellectual Property Office in the corresponding Chinese Patent Application No. 201480047003.9.
May 17, 2016, Notification of Reasons for Refusal issued by the Japan Patent Office in the corresponding Japanese Patent Application No. 2015-196023.
Jan. 26, 2016, Office Action issued by the Japan Patent Office in the corresponding Japanese Patent Application No. 2015-196023.
Nombona, N. et al., Photophysical and photochemical studies of sulfurcontaining phthalocyanine derivatives in the presence of folic acid, Inorganica Chimica Acta, 2012, vol. 392, pp. 380-387.
Nombona, N. et al., Synthesis of phthalocyanine conjugates with gold nanoparticles and liposomes for photodynamic therapy, Journal of Photochemistry and Photobiology, B: Biology, 2012, vol. 107, pp. 35-44.
Nombona, N. et al., Synthesis and photophysical studies of phthalocyanine-gold nanoparticle conjugates, Dalton Transactions, 2011, vol. 40, No. 44, pp. 11876-11884.
Moeno, S. et al., Synthesis and photophysical properties of a novel zinc photosensitizer and its gold nanoparticle conjugate, Journal of Photochemistry and Photobiology, A: Chemistry, 2011, vol. 22, No. 2-3, pp. 343-350.
Hone, D. C. et al., Generation of Cytotoxic Singlet Oxygen via Phthalocyanine-Stabilized Gold Nanoparticles: A Potential Delivery Vehicle for Photodynamic Therapy, Langmuir, 2002, vol. 18, No. 8, pp. 2985-2987.
Masiela, N. et al., Axial coordination of zinc and silicon phthalocyanines to silver and gold nanoparticles: an investigation of their photophysicochemical and antimicrobial behavior, Journal of Porphyrins and Phthalocyanines, vol. 17, No. 6-7, pp. 417-430.
Nov. 4, 2014, International Search Report issued in International Patent Application No. PCT/JP2014/004192.
Langmuir, 1997, vol. 13, No. 3, p. 460-4.
Physical Chemistry Chemical Physics, 2006, 8(28), p. 3314-9.
Apr. 28, 2015, International Search Report issued in the International Patent Application No. PCT/JP2015/052600.
Aug. 29, 2016 International Preliminary Report on Patentability issued in the International Patent Application No. PCT/JP2015/052785.
Apr. 28, 2015, International Search Report issued in the International Patent Application No. PCT/JP2015/052785.
Jun. 29, 2017 Office Action Issued in U.S. Appl. No. 14/382,078.
Jun. 27, 2017 Office Action issued in Korean Patent Application No. 2013-7021131.
Feb. 17, 2017 Office Action Issued in U.S. Appl. No. 14/914,334.
Aug. 8, 2017 Office Action Issued in U.S. Appl. No. 14/593,239.
U.S. Appl. No. 14/593,185, filed Jan. 9, 2015 in the name of Iwata et al.
U.S. Appl. No. 14/593,239, filed Jan. 9, 2015 in the name of Iwata et al.
U.S. Appl. No. 14/382,288, filed Aug. 29, 2014 in the name of Kaneko et al.
U.S. Appl. No. 14/382,078, filed Aug. 29, 2014 in the name of Mizuno et al.
U.S. Appl. No. 14/782,634, filed Oct. 6, 2015 in the name of Ishii et al.
U.S. Appl. No. 14/914,334, filed Feb. 25, 2016 in the name of Mizuno et al.
U.S. Appl. No. 15/112,959, filed Jul. 20, 2016 in the name of Ishii et al.
U.S. Appl. No. 15/116,298, filed Aug. 3, 2016 in the name of Iwata et al.
Jan. 26, 2018 Office Action issued in U.S. Appl. No. 14/593,239.
Mar. 6, 2017 Office Action Issued in U.S. Appl. No. 14/593,239.
Feb. 4, 2017 Office Action issued in Chinese Patent Application No. 201180068414.2.
Feb. 22, 2017 Office Action issued in U.S. Appl. No. 14/593,185.
Oct. 13, 2017 Office Action issued in U.S. Appl. No. 14/382,288.
Oct. 18, 2017 Office Action issued in U.S. Appl. No. 14/593,185.
Oct. 31, 2017 Office Action issued in U.S. Appl. No. 14/382,078.
U.S. Appl. No. 15/255,513, filed Sep. 2, 2016 in the name of Iwata et al.
U.S. Appl. No. 15/338,720, filed Oct. 31, 2016 in the name of Iwata et al.
Apr. 28, 2017 Office Action issued by the State Intellectual Property Office in the corresponding Chinese Patent Application No. 201580006986.6.
Nov. 27, 2017 Office Action issued in Chinese Patent Application No. 201180068414.2.
Dec. 27, 2017 Office Action issued in Korean Patent Application No. 10-2013-7021131.
May 2, 2018 Office Action issued in Chinese Patent Application No. 201180068414.02.
Aug. 3, 2018 Office Action issued in U.S. Appl. No. 14/382,288.
Nov. 6, 2018 Office Action issued in U.S. Appl. No. 14/382,078.
Sep. 20, 2018 Reexamination Decision issued in Chinese Patent Application No. 201180068414.2.
Vitale et al, "Mono- and bi-functional arenethiols as surfactants for gold nanoparticles: synthesis and characterization," Nanoscale Research Letters, 6:103, pp. 1-9, 2011.

* cited by examiner

A

B

TRANSPARENT CONDUCTIVE FILM, INFORMATION INPUT DEVICE, AND ELECTRONIC DEVICE

TECHNICAL FIELD

The present disclosure relates to a transparent conductive film, an information input device, and an electronic device, and in particular, to a transparent conductive film using metal nanowires as a conductive material, an information input device using the transparent conductive film, and an electronic device provided with the transparent conductive film on a display panel thereof.

BACKGROUND ART

A metallic oxide such as an indium tin oxide (ITO) has been used in a transparent conductive film in which light transmittance is required. Examples of such a transparent conductive film include a transparent conductive film provided on a display surface side of a display panel, and furthermore a transparent conductive film of an information input device arranged on the display surface side of the display panel. However, the transparent conductive film using a metal oxide is formed by sputtering in a vacuum environment, thereby increasing manufacturing cost. In addition, in the transparent conductive film, crack and delamination have been likely to occur due to deformation such as bending and distortion.

Therefore, in place of the transparent conductive film using a metal oxide, a transparent conductive film using a metal nanowire, which can be formed by coating or printing and also has a high resistance to bending and distortion, is considered. The transparent conductive film using a metal nanowire has also attracted attention as a next-generation transparent conductive film without using indium being a rare metal (for example, see Patent Literatures 1 and 2 and Non-Patent Literature 1 below).

However, when the transparent conductive film using a metal nanowire is provided on the display surface side of the display panel, outside light reflects diffusely on the surface of the metal nanowire, so that a so-called black floating phenomenon in which a black display of the display panel is displayed slightly bright occurs. The black floating phenomenon causes deterioration of display properties due to reduced contrast.

For the purpose of preventing occurrence of such black floating, a gold nanotube using gold (Au) on which diffused reflection is unlikely to occur has been proposed. The gold nanotube is formed by first using as a template a silver nanowire which is likely to reflect light diffusely, and then performing gold plating on the silver nanowire. Thereafter, a silver nanowire portion used as a template is subjected to etching or oxidation, thereby allowing it to be converted into a gold nanotube (see, for example, Patent Literature 3 described below).

Furthermore, a method of preventing light scattering by using a metal nanowire and a secondary conductive medium (such as a CNT (carbon nanotube), a conductive polymer, and an ITO) in combination has been proposed (see, for example, Patent Literature 2 described below).

CITATION LIST

Patent Literature

Patent Literature 1: Japanese Translation of PCT Application No. 2010-507199

Patent Literature 2: Japanese Translation of PCT Application No. 2010-525526

Patent Literature 3: Japanese Translation of PCT Application No. 2010-525527

Non-Patent Literature

Non-Patent Literature 1: "ACS Nano" 2010, Vol. 4, No. 5, p. 2955-2963

SUMMARY OF INVENTION

Technical Problem

However, in the gold nanotube obtained by the former method, not only the silver nanowire used as a template is wasted as a material, but also the metal material for performing gold plating is necessary. This increases material cost, and also manufacturing cost due to complicated processes.

In the latter method, since a secondary conductive medium (coloring material) such as a CNT, a conductive polymer, and an ITO is used in combination, transparency may be compromised.

Therefore, an object of the present disclosure is to provide a transparent conductive film capable of preventing diffused reflection of light on the surface of the metal nanowire while inhibiting increase of cost by using a metal material without waste. Another object of the present disclosure is to provide a transparent conductive film capable of maintaining transparency while preventing diffused reflection of light on the surface of the metal nanowire. Still another object of the present disclosure is to provide an information input device capable of preventing black floating caused by diffused reflection of light by using such a transparent conductive film as an electrode, and further to provide an electronic device capable of displaying with good contrast.

Solution to Problem

The transparent conductive film according to the present disclosure in order to achieve the above objects is characterized by including metal nanowires and a colored compound adsorbed by the metal nanowires. In such a transparent conductive film, diffused reflection of light on a surface of each of the metal nanowires is prevented by the fact that visible light is absorbed by the colored compound adsorbed by the metal nanowires. Furthermore, since the colored compound is adsorbed by the metal nanowires, reduction of transparency caused by addition of the colored compound can be suppressed.

The transparent conductive film according to the present disclosure is also characterized by including metal nanowires each having a surface and a colored compound coating at least part of the surface. In such a transparent conductive film, diffused reflection of light on the surface of the metal nanowire is prevented by the fact that visible light is absorbed by the colored compound coating at least part of the surface of the metal nanowire. Furthermore, since the colored compound is unevenly distributed on the surface of the metal nanowire, reduction of transparency caused by addition of the colored compound can be suppressed.

Furthermore, the information input device according to the present disclosure also has a structure in which the transparent conductive film configured by including the metal nanowires allowed to adsorb the colored compound is provided on a transparent substrate. In such an information input device, black floating of the transparent conductive film is prevented by using the transparent conductive film in which diffused reflection of light on the surface of the metal nanowires is prevented as described above.

Furthermore, the electronic device according to the present disclosure has a structure in which the transparent conductive film configured by including the metal nanowires allowed to adsorb the colored compound is provided on a display surface side of a display panel. In such an electronic device, black floating of the transparent conductive film is prevented by using the transparent conductive film in which diffused reflection of light on the surface of the metal nanowire is prevented as described above, thereby enabling high contrast display.

Advantageous Effects of Invention

As described above, according to the present disclosure, by allowing the metal nanowires to adsorb the colored compound to thereby prevent diffused reflection of light, black floating in the transparent conductive film using the metal nanowires can be prevented while suppressing cost increase by using the metal material without waste. In addition to this, in the electronic device provided with the transparent conductive film on the display surface side of the display panel, contrast can be improved by preventing black floating in the transparent conductive film on the display surface side.

DESCRIPTION OF EMBODIMENTS

Embodiments of the present disclosure will be described with reference to the drawings in the order shown below.
1. First embodiment (Structural example of a transparent conductive film)
2. Modification 1 (Structural example of a transparent conductive film provided with an overcoat layer)
3. Modification 2 (Structural example of a transparent conductive film provided with an anchor layer)
4. Modification 3 (Structural example of a transparent conductive film formed not by dispersing metal nanowires in a resin but by accumulating the same)
5. Modification 4 (Structural example of a transparent conductive film provided with a hard coat layer on one main surface of a substrate)
6. Modification 5 (Structural example of a transparent conductive film provided with hard coat layers on both main surfaces of a substrate)
7. Second embodiment (Manufacturing method of a transparent conductive film in which adsorption treatment of a colored compound is performed after film formation)
8. Third embodiment (Manufacturing method of a transparent conductive film in which film formation is performed after adsorption of a colored compound)
9. Fourth embodiment (Structural example of an information input device using a transparent conductive film)
10. Fifth embodiment (Structural example of a display device provided with an information input device)
11. Sixth embodiment (Structural example of a display device using a transparent conductive film)
12. Seventh embodiment (Structural example of an electronic device provided with a display part)

«1 First Embodiment (Structural Example of a Transparent Conductive Film)»

Figure 1:
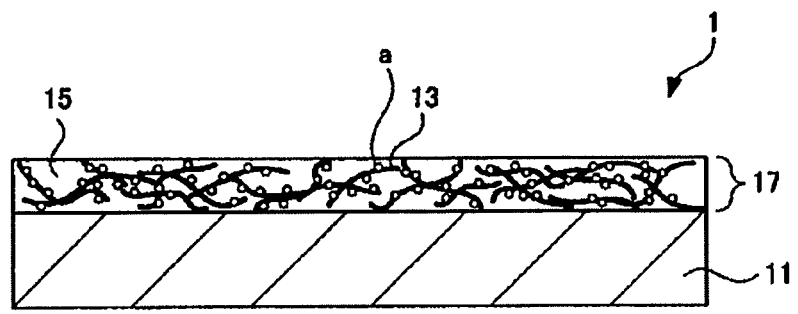
FIG. 1 is a cross-sectional schematic view illustrating a structure of a transparent conductive film according to a first embodiment.

FIG. 1 is a cross-sectional schematic view for illustrating a structure of a transparent conductive film. As shown in FIG. 1, a transparent conductive film 1 according to a first embodiment is configured by accumulating metal nanowires 13 on, for example, a transparent substrate 11, and is characterized in that the metal nanowires 13 are allowed to adsorb a colored compound a. Here, as an example, the metal nanowires 13 are dispersed in a transparent resin material 15 to form an adsorption wire layer (transparent conductive film) 17, and the adsorption wire layer 17 is provided on the transparent substrate 11, thereby forming a structure in which the metal nanowires 13 are cumulated on the transparent substrate 11. The details of these components will be described in order below.

<Transparent Substrate 11>

The transparent substrate 11 is composed of a material having transmittance to visible light, for example, an inorganic material or a plastic material. Such a transparent substrate 11 has a film thickness required for the transparent conductive film 1. For example, the transparent substrate 11 may have a film (sheet) shape in which the transparent substrate 11 is thinned such that flexible bending can be realized, or a substrate shape having such a film thickness that appropriate bending and rigidity can be realized.

Examples of an inorganic material constituting the transparent substrate 11 include quartz, sapphire, and glass.

Furthermore, as a plastic material constituting the transparent substrate 11, for example, a publicly-known polymeric material can be used. Examples of the publicly-known polymeric material includes triacetyl cellulose (TAC), polyester (TPEE), polyethylene terephthalate (PET), polyethylene naphthalate (PEN), polyimide (PI), polyamide (PA), aramid, polyethylene (PE), polyacrylate, polyethersulfone, polysulfone, polypropylene (PP), diacetyl cellulose, polyvinyl chloride, acrylic resins (PMMA), polycarbonate (PC), epoxy resins, urea resins, urethane resins, melamine resins, and cycloolefin polymers (COP). When such a plastic material is used to form the transparent substrate 11, the film thickness of the transparent substrate 11 is preferably, but not particularly limited to, 5 to 500 μm in terms of productivity.

<Metal Nanowire 13>

At least part of the surface of the metal nanowire 13 is coated with the colored compound a. Accordingly, visible light is absorbed by the colored compound coating the at least part of the surface of the metal nanowire, thereby preventing diffused reflection of light on the surface of the metal nanowire.

The metal nanowire 13 is structured by using a metal, and is a fine wire having a diameter of the order of nm. Such a metal nanowire 13 is composed of one or more elements selected from Ag, Au, Ni, Cu, Pd, Pt, Rh, Ir, Ru, Os, Fe, Co, and Sn as a constituent element.

A preferred shape of the metal nanowire 13 is configured such that the average minor axis diameter is longer than 1 nm and equal to or shorter than 500 nm, and that the average major axis length is longer than 1 μm and equal to or shorter than 1000 μm. When the average minor axis diameter is equal to or shorter than 1 nm, electrical conductivity of the metal nanowires 13 deteriorates, so that the metal nanowires 13 are difficult to function as a conductive film after coated. On the other hand, when the average minor axis diameter is longer than 500 nm, total light transmittance of the transparent conductive film 1 deteriorates. When the average major axis length is equal to or shorter than 1 μm, the metal nanowires are difficult to be linked to each other, and the transparent conductive film 1 is difficult to function as a conductive film. On the other hand, when the average major axis length is longer than 1000 μm, total light transmittance of the transparent conductive film 1 deteriorates, and at the same time, dispersibility of the metal nanowires 13 in a dispersion liquid used for forming the transparent conductive film 1 tends to deteriorate. Furthermore, the metal nanowire 13 may have a wire shape in which metal nanoparticles are linked to each other in a beaded manner. In this case, the length is not limited.

The coating weight of such metal nanowires 13 is preferably 0.001 to 1.000 [g/m$^2$]. When the coating weight is less than 0.001 [g/m$^2$], the metal nanowires 13 are not sufficiently present in the adsorption wire layer 17, and conductivity of the transparent conductive film 1 deteriorates. On the other hand, a larger coating weight of the metal nanowires 13 decreases the sheet resistance value. However, when the coating weight is more than 1.000 [g/m$^2$], total light transmittance of the transparent conductive film 1 deteriorates.

<Transparent Resin Material 15>

The transparent resin material 15 is a so-called binder material, used for dispersing the metal nanowires 13. The transparent resin material 15 used herein can be variously selected from known transparent natural polymeric resins or synthetic polymeric resins, and may be thermoplastic resins, or thermosetting resins or photo-curable resins. Examples of the thermoplastic resins include polyvinyl chloride, vinyl chloride-vinyl acetate copolymer, poly(methyl methacrylate), cellulose nitrate, chlorinated polyethylene, chlorinated polypropylene, vinylidene fluoride, ethyl cellulose, and hydroxypropyl methyl cellulose. Examples of the thermosetting (photo-curable) resins which are cured by heat, light, electron beam, and radiation include melamine acrylate, urethane acrylate, isocyanate, epoxy resins, polyimide resins, and silicon resins such as acrylic-modified silicate.

Furthermore, a surfactant, a viscosity adjusting agent, a dispersant, a cure promoting catalyst, and a plasticizer, as well as a stabilizer such as an antioxidant and an anti-sulfurizing agent, are added as additives to the transparent resin material 15 as necessary.

<Colored Compound a>

The colored compound a has absorption in the visible light region, and adsorbs to the metal nanowire 13. Here, the visible light region is defined as a wavelength range approximately equal to or longer than 360 nm and equal to or shorter than 830 nm. The colored compound a has a chromophoric group R which has absorption in the visible light region and a functional group X which is bound to the metal constituting the metal nanowire 13, and is represented by the general formula [R—X].

Among these, the chromophoric group [R] includes at least one or more of an unsaturated alkyl group, an aromatic ring, a heterocyclic ring, and a metal ion. Concrete examples of the chromophoric group [R] include a nitroso group, a nitro group, an azo group, a methine group, an amino group, a ketone group, a thiazolyl group, a naphthoquinone group, a stilbene derivative, an indophenol derivative, a diphenylmethane derivative, an anthraquinone derivative, a triarylmethane derivative, a diazine derivative, an indigoid derivative, a xanthene derivative, an oxazine derivative, a phthalocyanine derivative, an acridine derivative, a thiazine derivate, a sulfur atom-containing compound, and a metal ion-containing compound. Furthermore, as the chromophoric group [R], at least one or more selected from the group consisting of the above-mentioned examples of the chromophoric group and the compounds containing the same can be used. In terms of improved transparency of the transparent conductive film 1, at least one or more selected from the group consisting of a Cr complex, a Cu complex, an azo group, an indoline group, and a compound containing the same can be used as the chromophoric group [R].

Examples of the functional group [X] which is bound to the metal constituting the metal nanowire 13 include a sulfo group (including a sulfonate salt), a sulfonyl group, a sulfonamide group, a carboxylic acid group (including a carboxylate salt), an amino group, an amide group, a phosphate group (including a phosphate and a phosphate ester), a phosphino group, a silanol group, an epoxy group, an isocyanate group, a cyano group, a vinyl group, a thiol group, and a carbinol group. At least one of the functional groups [X] may be present in the colored compound a. In order to inhibit reduction of conductivity caused by adsorption of the colored compound a, a carboxylic acid group, a phosphate group, and the like are preferable as a functional group [X], and a carboxylic acid group is more preferable.

Furthermore, the functional group [X] may be an atom which can be coordinated to the metal constituting the metal nanowire 13. Examples of such an atom include N (nitrogen), S (sulfur), and O (oxygen). When the functional group [X] is any of these atoms, the functional group [X] may constitute part of the chromophoric group [R], and the colored compound a becomes a compound having a heterocyclic ring.

Examples of the above-described colored compound a include acidic dyes and direct dyes. Examples of a more concrete dye include, as a dye having a sulfo group, Kayakalan BordeauxBL, Kayakalan Brown GL, Kayakalan Gray BL167, Kayakalan Yellow GL143, KayakalanBlack 2RL, Kayakalan Black BGL, Kayakalan Orange RL, Kayarus Cupro Green G, Kayarus Supra Blue MRG, and Kayarus Supra Scarlet BNL200 manufactured by Nippon Kayaku Co., Ltd.; and Lanyl Olive BG manufactured by Taoka Chemical Company, Limited. Other examples include Kayalon Polyester Blue 2R-SF, Kayalon Microester Red AQ-LE, Kayalon Polyester Black ECX300, and Kayalon Microester Blue AQ-LE manufactured by Nippon Kayaku Co., Ltd. Furthermore, as a dye having a carboxyl group, a pigment for dye-sensitized solar cells is included. Examples of such a pigment includes N3, N621, N712, N719, N749, N773, N790, N820, N823, N845, N886, N945, K9, K19, K23, K27, K29, K51, K60, K66, K69, K73, K77, Z235, Z316, Z907, Z907Na, Z910, Z991, CYC-B1, and HRS-1, which are each a Ru complex; and Anthocyanine, WMC234, WMC236, WMC239, WMC273, PPDCA, PTCA, BBAPDC, NKX-2311, NKX-2510, NKX-2553 (manufactured by Hayashibara Biochemical Laboratories, Incorporated), NKX-2554 (manufactured by Hayashibara Biochemical Laboratories, Incorporated), NKX-2569, NKX-2586, NKX-2587 (manufactured by Hayashibara Biochemical Laboratories, Incorporated), NKX-2677 (manufactured by Hayashibara Biochemical Laboratories, Incorporated), NKX-2697, NKX-2753, NKX-2883, NK-5958 (manufactured by Hayashibara Biochemical Laboratories, Incorporated), NK-2684 (manufactured by Hayashibara Biochemical Laboratories, Incorporated), Eosin Y, Mercurochrome, MK-2 (manufactured by Soken Chemical & Engineering Co., Ltd.), D77, D102 (manufactured by Mitsubishi Paper Mills, Ltd.), D120, D131 (manufactured by Mitsubishi Paper Mills, Ltd.), D149 (manufactured by Mitsubishi Paper Mills, Ltd.), D150, D190, D205 (manufactured by Mitsubishi Paper Mills, Ltd.), D358 (manufactured by Mitsubishi Paper Mills, Ltd.), JK-1, JK-2, 5, ZnTPP, H2TC1PP, H2TC4PP, Phthalocyanine Dye (Zinc phtalocyanine-2,9,16,23-tetra-carboxylic acid, 2-[2'-(zinc9', 16',23'-tri-tert-butyl-29H,31H-phthalocyanyl)]succinic acid, Polythiohene Dye (TT-1), Pendant type polymer, and Cyanine Dye (P3TTA, C1-D, SQ-3, and B1), as an organic pigment.

The colored compound a constituting the transparent conductive film 1 is a compound that can be adsorbed by the metal constituting the metal nanowire 13 and be dissolved in the solvent used in a manufacturing process of the transparent conductive film 1 at a predetermined concentration. Such a compound is selected from the compounds represented by the above-mentioned formula [R-X] for each metal constituting the metal nanowire 13.

<Others>

To improve the dispersibility of the metal nanowire 13, a dispersant may be adsorbed by the metal nanowire 13. As a dispersant, polyvinylpyrrolidone (PVP) or an amino group-containing compound such as polyethylenimine is used. Other dispersants to be used include a compound which can be adsorbed by a metal and has a functional group such as a sulfo group (including a sulfonate salt), a sulfonyl group, a sulfonamide group, a carboxylic acid group (including a carboxylate salt), an amide group, a phosphate group (including a phosphate and a phosphate ester), a phosphino group, a silanol group, an epoxy group, an isocyanate group, a cyano group, a vinyl group, a thiol group, and a carbinol group.

These dispersants are adsorbed by the metal nanowire 13 in such an amount that conductivity of the transparent conductive film 1 does not deteriorate.

Additives other than a dispersant may be contained as necessary in order to improve adhesion and durability between the metal nanowires 13 or with the transparent substrate 11.

Furthermore, the colored compound a preferably coats the surface of the metal nanowire at a single-molecule level. Thus, reduction of transparency to visible light can be suppressed. In addition, the amount of the colored compound a to be used can be minimized.

The colored compound a is preferably unevenly distributed only on the surface of the metal nanowire. Thus, reduction of transparency to visible light can be suppressed. In addition, the amount of the colored compound a to be used can be minimized.

The reflection L value of the transparent conductive film 1 configured as above is preferably equal to or less than 8 as determined by the reflection L evaluation method described in the examples below. In this condition, a black floating phenomenon can be improved, and the transparent conductive film can be suitably applied to the use of arranging the film on a display surface side of a display panel. In this case, the reflection L value is controlled by the adsorption amount of the colored compound a by the metal nanowires 13.

<Effects of First Embodiment>

In the transparent conductive film 1 according to the first embodiment described above, the following effects can be exerted. That is, by adsorption of the colored compound a by the metal nanowire 13, diffused reflection of light on the surface of the metal nanowire 13 can be prevented. In particular, since the colored compound a has a chromophoric group R which absorbs light in the visible light region, outside light is absorbed by the colored compound a, so that an effect of preventing diffused reflection can highly be obtained.

Furthermore, since the transparent conductive film 1 is configured by adsorbing the colored compound a by the metal nanowire 13, increase of the manufacturing cost can also be suppressed by using a metal material without waste.

In the first embodiment described above, the structure in which the adsorption wire layer 17 is provided on the transparent substrate 11 has been described as a transparent conductive film 1. However, the transparent conductive film 1 may be configured such that the transparent substrate 11 is eliminated and only the adsorption wire layer 17 is provided.

Incident light which impinges on the surface of the metal nanowire and causes black floating to occur is basically light that does not transmit the transparent conductive film or the like. The colored compound a used in the transparent conductive film 1 according to the first embodiment has a function of absorbing incident light which impinges on the surface of the metal nanowire and causes black floating to occur. For this reason, although the colored compound a is used in the transparent conductive film 1 according to the first embodiment, reduction of transparency can be suppressed.

Whether the colored compound a is adsorbed by the metal nanowires 13 or not can be checked by the following method. First, the transparent conductive film containing the metal nanowires 13 to be checked is immersed for several hours to ten and several hours in a solution capable of etching a known metal. Then, the adsorbed compound is extracted together with the metal nanowires 13. Subsequently, the solvent is removed from the extracted liquid by heating or reduced pressure, thereby to concentrate the extracted components. In this case, separation by chromatography may be performed as necessary. Next, a gas chromatograph (GC) analysis of the above-mentioned concentrated extracted components is performed to confirm the molecule of the adsorbed compound and its fragment, thereby enabling determination of the adsorbed compound. By using a deuterium substitution solvent for extraction of the adsorbed compound, the adsorbed compound can also be determined by an NMR analysis.

When the determined adsorbed compound has the chromophoric group [R], it means that the colored compound a was adsorbed by the metal nanowire 13.

Therefore, the above-mentioned effects of the first embodiment can be obtained.

«2. Modification 1 (Structural Example of a Transparent Conductive Film Provided with an Overcoat Layer)»

Figure 2:
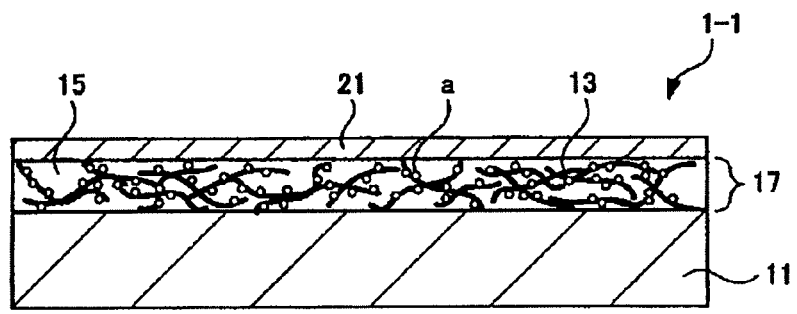
FIG. 2 is a cross-sectional schematic view illustrating a structure of a transparent conductive film according to a modification 1.

FIG. 2 shows, as a modification 1 of the transparent conductive film, a structure of a transparent conductive film 1-1 in which an overcoat layer 21 is provided to the transparent conductive film according to the first embodiment. The overcoat layer 21 is provided for protecting the adsorption wire layer 17 configured by using the metal nanowires 13, and arranged on the top of the adsorption wire layer 17.

It is important that the overcoat layer 21 has light transmittance to visible light.

The overcoat layer 21 is composed of a polyacryl-based resin, a polyamide-based resin, a polyester-based resin, or a cellulose-based resin. Alternatively, the overcoat layer 21 is composed of a hydrolysis product or a dehydration-condensation product of a metal alkoxide. Furthermore, the overcoat layer 21 has such a film thickness that light transmittance to visible light is not inhibited. The overcoat layer 21 may have at least one function selected from the function group consisting of a hard coat function, an anti-glare function, an anti-reflection function, an anti-Newton ring function, an anti-blocking function, and the like.

«3. Modification 2 (Structural Example of a Transparent Conductive Film Provided with an Anchor Layer)»

Figure 3:
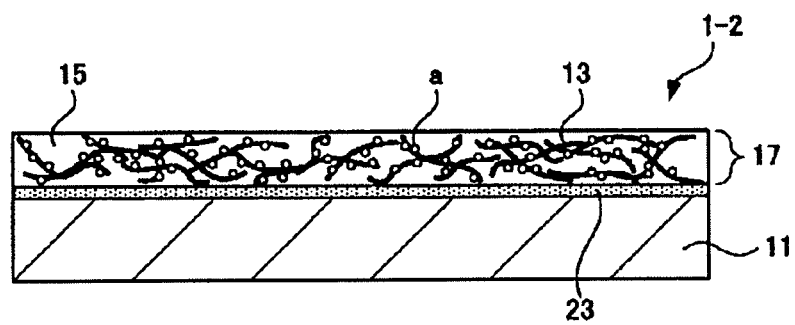
FIG. 3 is a cross-sectional schematic view illustrating a structure of a transparent conductive film according to a modification 2.

FIG. 3 shows, as a modification 2 of the transparent conductive film, a structure of a transparent conductive film 1-2 in which an anchor layer 23 is provided to the transparent conductive film according to the first embodiment. The anchor layer 23 is provided for ensuring adhesion between the adsorption wire layer 17 configured by using the metal nanowires 13 and the transparent substrate 11, and arranged between the adsorption wire layer 17 and the transparent substrate 11.

It is important that the anchor layer 23 has light transmittance to visible light. The anchor layer 23 is composed of a polyacryl-based resin, a polyamide-based resin, a polyester-based resin, or a cellulose-based resin. Alternatively, the anchor layer 23 is composed of a hydrolysis product or a dehydration-condensation product of a metal alkoxide. Furthermore, the anchor layer 23 has such a film thickness that light transmittance to visible light is not inhibited.

Here, the modification 2 can be combined with the modification 1. When combined, the adsorption wire layer 17 configured by using the metal nanowires 13 is arranged between the anchor layer 23 and the overcoat layer 21.

«4. Modification 3 (Structural Example of a Transparent Conductive Film Formed not by Dispersing Metal Nanowires in a Resin but by Accumulating the Same)»

Figure 4:
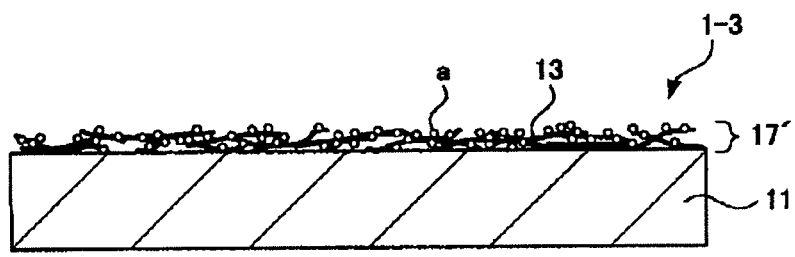
FIG. 4 is a cross-sectional schematic view illustrating a structure of a transparent conductive film according to a modification 3.

FIG. 4 shows, as a modification 3 of the transparent conductive film, a structure of a transparent conductive film 1-3 in which the transparent resin material is eliminated from the transparent conductive film according to the first embodiment. The metal nanowires 13 allowed to adsorb the colored compound a are cumulated on the transparent substrate 11 without being dispersed in a transparent resin material. Thus, the adsorption wire layer 17' configured by accumulating the metal nanowires 13 having been allowed to adsorb the colored compound a is arranged on the transparent substrate 11 while maintaining the adhesion with the surface of the transparent substrate 11. Such a structure is applied to a case when adhesions between the metal nanowires 13 and between the metal nanowire 13 and the transparent substrate 11 are favorable.

Here, the modification 3 can be combined with at least one of the modification 1 and the modification 2. That is, the modification 3 may be combined with the modification 1 to provide the overcoat layer above the adsorption wire layer 17', or the modification 3 may be combined with the modification 2 to provide the anchor layer between the transparent substrate 11 and the adsorption wire layer 17'.

Even in the transparent conductive film 1-3 configured as described above, the metal nanowires 13 are allowed to adsorb the colored compound a. Therefore, the effects similar to those of the transparent conductive film configured as described in the first embodiment can be obtained.

«5. Modification 4 (Structural Example of a Transparent Conductive Film Provided with a Hard Coat Layer on One Main Surface of a Substrate)»

Figure 15:
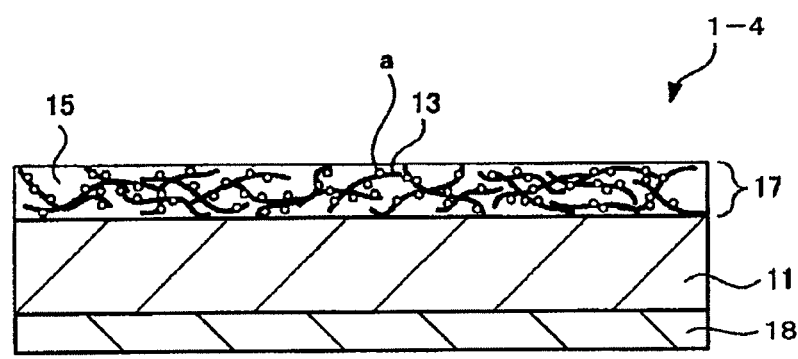
FIG. 15 is a cross-sectional schematic view illustrating a structure of a transparent conductive film according to a modification 4.

FIG. 15 shows, as a modification 4 of the transparent conductive film, a structure of a transparent conductive film 1-4 in which a hard coat layer 18 is provided to the transparent conductive film according to the first embodiment. The hard coat layer 18 is provided for protecting the substrate 11, and arranged on the bottom of the substrate 11.

It is important that the hard coat layer 18 has light transmittance to visible light.

The hard coat layer 18 is composed of an organic hard coat agent, an inorganic hard coat agent, an organic-inorganic hard coat agent, or the like. Furthermore, the hard coat layer 18 has such a film thickness that light transmittance to visible light is not inhibited.

Here, the modification 4 can be combined with at least one of the modifications 1 to 3. For example, the overcoat layer or the anchor layer may be further provided. The anchor layer may be arranged, for example, at least between the substrate 11 and the adsorption wire layer 17 and/or between the substrate 11 and the hard coat layer 18. The overcoat layer may be arranged, for example, on at least one of the top of the adsorption wire layer 17 and the top of the hard coat layer 18.

«6. Modification 5 (Structural Example of a Transparent Conductive Film Provided with Hard Coat Layers on Both Main Surfaces of a Substrate)»

Figure 16:
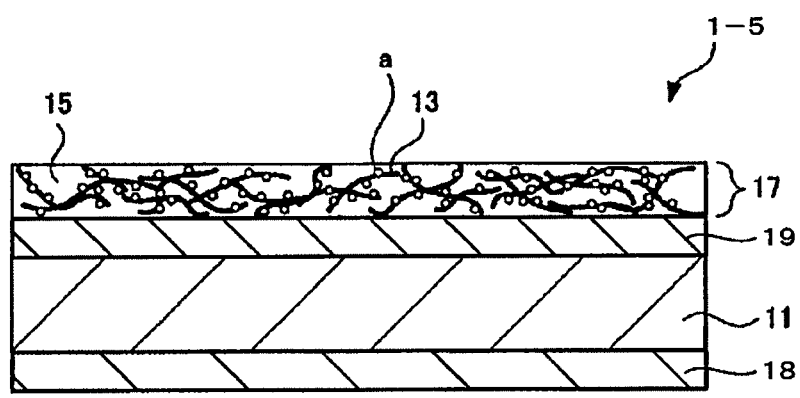
FIG. 16 is a cross-sectional schematic view illustrating a structure of a transparent conductive film according to a modification 5.

FIG. 16 shows, as a modification 5 of the transparent conductive film, a structure of a transparent conductive film 1-5 in which hard coat layers 18 and 19 are provided to the transparent conductive film according to the first embodiment. The hard coat layer 18 is provided for protecting the substrate 11, and arranged on the bottom of the substrate 11. The hard coat layer 19 is provided for protecting the substrate 11, and arranged on the top of the substrate 11. The adsorption wire layer 17 is arranged on the top of the hard coat layer 19.

It is important that the hard coat layers 18 and 19 have light transmittance to visible light. The hard coat layers 18 and 19 each are composed of an organic hard coat agent, an inorganic hard coat agent, an organic-inorganic hard coat agent, or the like. Furthermore, the hard coat layers 18 and 19 have such a film thickness that light transmittance to visible light is not inhibited.

Here, the modification 5 can be combined with at least one of the modification 1 to 3. For example, the overcoat layer or the anchor layer may be further provided. The anchor layer is arranged, for example, at least one of a position between the substrate 11 and the hard coat layer 19, a position between the hard coat layer 19 and the adsorption wire layer 17, and a position between the substrate 11 and the hard coat layer 18. The overcoat layer is arranged, for example, on at least one of the top of the adsorption wire layer 17 and the top of the hard coat layer 18.

«7. Second Embodiment Manufacturing Method of a Transparent Conductive Film in which an Adsorption Treatment of a Colored Compound is Performed after Film Formation)»

Figure 5:
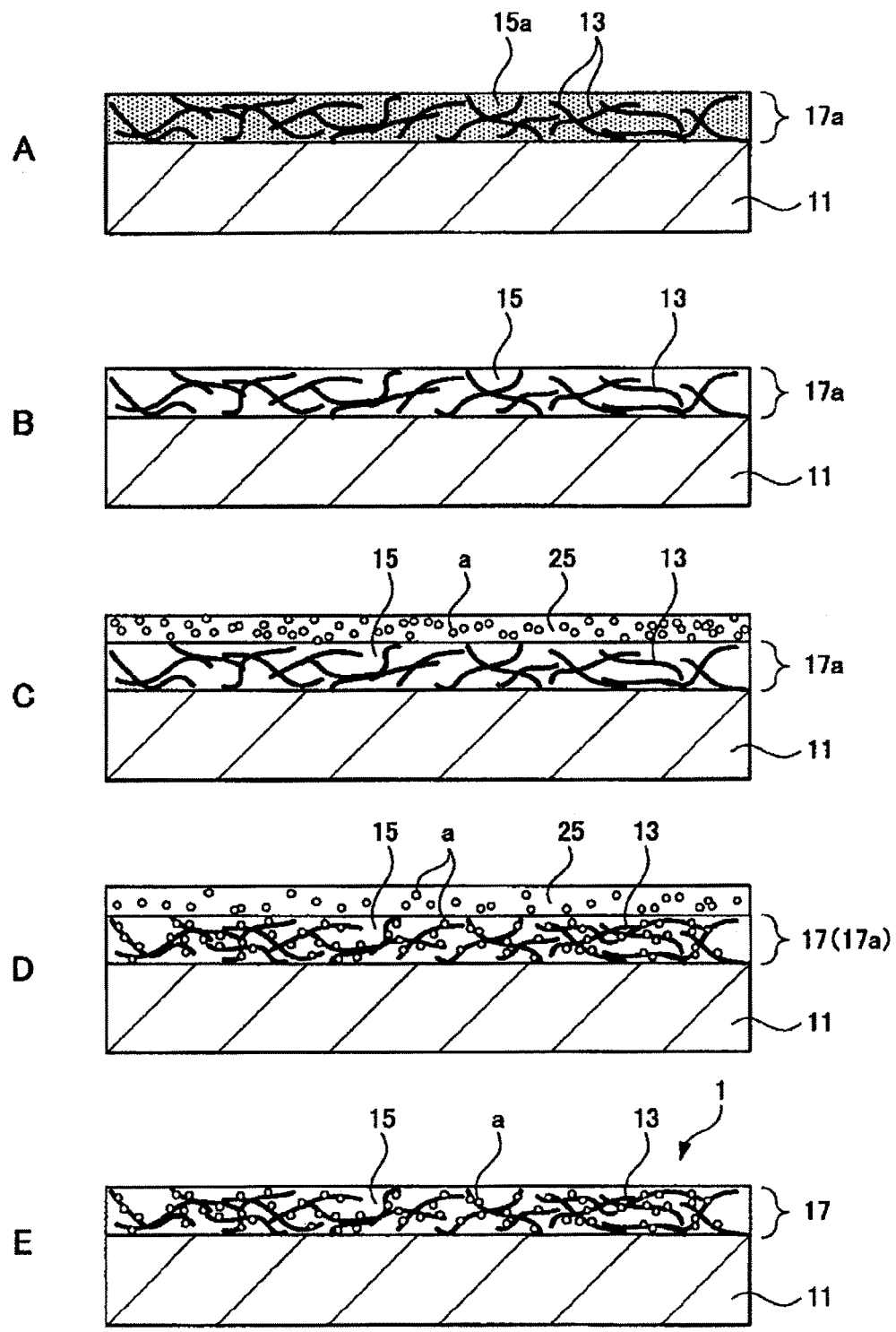
FIG. 5A to FIG. 5E each are a process view showing a manufacturing method of a transparent conductive film according to a second embodiment.

Next, with reference to FIG. 5, a method of performing an adsorption treatment of a colored compound after the formation of a dispersion film of metal nanowires will be described as a first example of the manufacturing method of a transparent conductive film.

[Preparation of Dispersion Liquid]

First, a dispersion liquid in which metal nanowires are dispersed in a solvent is prepared. Here, a transparent resin material (being a binder) is added together with metal nanowires in a solvent. Furthermore, as necessary, a dispersant for improving dispersibility of the metal nanowires and other additives for improving adhesion and durability are mixed in the mixture.

As a dispersion method, agitation, ultrasonic dispersion, bead dispersion, kneading, homogenizer treatment, and the like can be preferably applied.

When the weight of the dispersion liquid is 100 parts by weight, the amount of the metal nanowires to be mixed in the dispersion liquid is 0.01 to 10.00 parts by weight. When the amount is less than 0.01 parts by weight, a sufficient coating weight (0.001 to 1.000 [$g/m^2$]) of the metal nanowires cannot be obtained in the resulting transparent conductive film. On the other hand, when the amount is more than 10 parts by weight, the dispersibility of the metal nanowires tends to deteriorate. Furthermore, when a dispersant is added in the dispersion liquid, the amount to be added is preferably determined such that conductivity of the resulting transparent conductive film does not deteriorate.

<Solvent>

Here, as a solvent to be used for preparing the above dispersion liquid, a solvent in which the metal nanowires can be dispersed is used. For example, at least one or more selected from water, alcohol (for example, methanol, ethanol, n-propanol, i-propanol, n-butanol, butanol, sec-butanol, tert-butanol), anone (for example, cyclohexanone, cyclopentanone), amide (for example, N,N-dimethylformamide: DMF), sulfide (for example, dimethyl sulfoxide: DMSO), and the like are used.

In order to suppress uneven drying and crack of a dispersion film formed using the dispersion liquid, a high boiling point solvent can be further added in the dispersion liquid to control the speed of the solvent to evaporate from the dispersion liquid. Examples of the high boiling point solvent include butyl cellosolve, diacetone alcohol, butyl triglycol, propylene glycol methyl ether, propylene glycol monoethyl ether, ethylene glycol monoethyl ether, ethylene glycol monopropyl ether, ethylene glycol monoisopropyl ether, diethylene glycol monobutyl ether, diethylene glycol monoethyl ether, diethylene glycol monomethyl ether, diethylene glycol diethyl ether, dipropylene glycol monomethyl ether, tripropylene glycol monomethyl ether, propylene glycol monobutyl ether, propylene glycol isopropyl ether, dipropylene glycol isopropyl ether, tripropylene glycol isopropyl ether, and methyl glycol. These high boiling point solvents may be used alone or as a mixture of two or more.

[Formation of Dispersion Film]

Next, as shown in FIG. 5A, using the dispersion liquid prepared as described above, a dispersion film 17a in which the metal nanowires 13 are dispersed is formed on a transparent substrate 11. A method of forming the dispersion film 17a is not limited, but a wet film forming method is preferable in view of physical properties, convenience, manufacturing cost, and the like. As a wet film forming method, a known method such as a coating method, a spraying method, or a printing method is applied. The coating method is not particularly limited, and a known coating method can be used. Examples of a known coating method include a micro-gravure coating method, a wire bar coating method, a direct gravure coating method, a die coating method, a dipping method, a spray coating method, a reverse roll coating method, a curtain coating method, a comma coating method, a knife coating method, and a spin coating method. Examples of a printing method include letterpress, offset, gravure, intaglio, rubber plate, screen, and ink-jet printings.

In this state, the dispersion film 17a in which the metal nanowires 13 are dispersed in the solvent containing an uncured transparent resin material (being a binder) 15a is formed.

[Drying and Curing of Dispersion Film]

Next, as shown in FIG. 5B, the solvent in the dispersion film 17a formed on the transparent substrate 11 is dried and then removed. Removal of the solvent by drying may be performed by natural drying or heat drying. Thereafter, a curing treatment of an uncured transparent resin material (15a) is performed, so that the metal nanowires 13 are dispersed in a cured transparent resin material 15. Thereafter, to reduce the sheet resistance value of the obtained transparent conductive film, a pressurizing treatment with a calendar is performed as necessary.

[Preparation of Treatment Solution]

A treatment solution containing a colored compound is prepared. Here, a treatment solution is prepared by, for example, dissolving a colored compound in a solvent. The concentration of the colored compound in the treatment solution is preferably high, in order to improve the adsorption rate of the colored compound by the metal nanowires in the adsorption treatment using the treatment solution. Specifically, the concentration of the colored compound in the treatment solution is preferably equal to or more than 0.01% by weight. When the colored compound is liquid at normal temperatures, or can be in a liquid state when heated at a temperature acceptable for the process, the liquid colored compound may be used as a treatment solution as it is.

<Solvent>

The solvent used for preparing the treatment solution may be appropriately selected such that the colored compound can be dissolved at a predetermined concentration. Specifically, examples of such a solvent include water, acetonitrile, 3-methoxypropionitrile, 3,3-diethoxypropionitrile, ethoxypropionitrile, 3-ethoxypropionitrile, 3,3'-oxydipropionitrile, 3-aminopropionitrile, propionitrile, cyanoacetic acid propyl, 3-methoxypropyl isothiocyanate, 3-phenoxypropionitrile, p-anisidine 3-(phenylmethoxy)propanenitrile, methanol, ethanol, propanol, isopropyl alcohol, n-butanol, 2-butanol, isobutanol, t-butanol, ethylene glycol, triethylene glycol, 1-methoxy-ethanol, 1,1-dimethyl-2-methoxyethanol, 3-methoxy-1-propanol, dimethyl sulfoxide, benzene, toluene, o-xylene, m-xylene, p-xylene, chlorobenzene, dichlorobenzene, butyl acetate, ethyl acetate, cyclohexane, cyclohexanone, ethyl methyl ketone, acetone, and dimethylformamide. These solvents may be used alone, or as a mixture of two or more.

[Adsorption Treatment of Colored Compound]

Next, as shown in FIG. 5C, the dispersion film 17a, in which the metal nanowires 13 are dispersed in the cured transparent resin material 15, is contacted with a treatment solution 25 in which the colored compound a is dissolved.

Accordingly, as shown in FIG. 5D, the colored compound a in the treatment solution 25 is adsorbed by the metal nanowires 13 in the dispersion film 17a, thereby to form an adsorption wire layer 17. In such an adsorption treatment, the colored compound a in the treatment solution 25 and the metal material constituting the metal nanowire 13 are allowed to be bound by covalent bonding or coordination bonding.

A concrete example of the adsorption treatment includes an immersion method in which the dispersion film 17a including the metal nanowires 13 dispersed therein is immersed in the treatment solution 25, or a coating method or a printing method in which a liquid film of the treatment solution 25 is formed on the dispersion film 17a.

When the immersion method is applied, the treatment solution 25 is prepared in an amount that allows the dispersion film 17a to be sufficiently immersed, and the dispersion film 17a is immersed in the treatment solution 25 for 0.1 seconds to 48 hours. Meanwhile, by performing at least one of heat and ultrasonic treatments, the adsorption rate of the colored compound a to the metal nanowires 13 can be increased. Following the immersion, the dispersion film 17a is washed with a good solvent of the colored compound as necessary, and a process of removing the non-adsorbed colored compound that is left in the dispersion film 17a is performed.

When the coating method is applied, an appropriate method is selected from, for example, a micro-gravure coating method, a wire bar coating method, a direct gravure coating method, a die coating method, a dipping method, a spray coating method, a reverse roll coating method, a curtain coating method, a comma coating method, a knife coating method, and a spin coating method, to form a liquid film of the treatment solution 25 on the dispersion film 17a.

When the printing method is applied, an appropriate method is selected from, for example, a letterpress printing method, an offset printing method, a gravure printing method, an intaglio printing method, a rubber plate printing method, an ink-jet method, and a screen printing method, to form a liquid film of the treatment solution 25 on the dispersion film 17a.

When the coating method or the printing method is applied, by performing at least one of heat and ultrasonic treatments in a state in which a certain amount of liquid film of the treatment solution 25 is formed on the dispersion film 17a, the adsorption rate of the colored compound a by the metal nanowires 13 can be increased. When a certain time has passed after the liquid film of the treatment solution 25 was formed, the dispersion film 17a is washed with a good solvent of the colored compound a as necessary, and a process of removing the non-adsorbed colored compound that is left in the dispersion film 17a is performed.

In this case, formation of a certain amount of liquid film of the treatment solution 25 does not need to be achieved by performing liquid film formation once. The formation may be achieved by repeating the forming process and the washing process described above more than once.

[Drying Treatment]

Following the adsorption treatment as described above, as shown in FIG. 5E, a drying treatment of the adsorption wire layer 17 is performed. This drying treatment may be performed by natural drying, or by heat drying in a heating device. Thus, the manufacturing of a transparent conductive film 1 provided with the adsorption wire layer 17 on the transparent substrate 11 is completed.

[Regarding Patterning]

When the manufacturing method according to the present second embodiment is applied to prepare a transparent conductive film having an electrode pattern including the adsorption wire layer 17, a previously patterned dispersion film 17a may be formed in the process of forming the dispersion film 17a described with reference to FIG. 5A. Pattern formation of the dispersion film 17a may be conducted by, for example, a printing method. As another method, the dispersion film 17a or the adsorption wire layer 17 is subjected to pattern etching in a process after the dispersion film 17a formed in FIG. 5A has been cured. In this case, the pattern etching may be performed at least so that the metal nanowires 13 are divided and put in an insulated state, in a region other than an electrode pattern in the dispersion film 17a or the adsorption wire layer 17.

[Others]

When preparing the transparent conductive film 1-1 in which the overcoat layer 21 is provided on the top of the adsorption wire layer 17, as in the modification 1 described with reference to FIG. 2, a process of further forming the overcoat layer 21 on the top of the adsorption wire layer 17 may be performed. Furthermore, when preparing the transparent conductive film 1-2 in which the anchor layer 23 is provided between the transparent substrate 11 and the adsorption wire layer 17, as in the modification 2 described with reference to FIG. 3, the anchor layer 23 is formed on the transparent substrate 11 prior to the formation of the dispersion film 17a. Thereafter, a process of forming the dispersion film 17a on the anchor layer 23 and the subsequent process thereto may be performed.

Furthermore, when preparing the adsorption wire layer 17' configured without using the transparent resin material, as in the modification 3 described with reference to FIG. 4, the dispersion liquid constituting the dispersion film 17a is formed without using the transparent conductive material. Accordingly, when the solvent is removed from the dispersion film 17a formed on the transparent substrate 11, the metal nanowires 13 are left on the transparent substrate 11 in a state of being cumulated. In this state, the metal nanowires 13 are cumulated in a state of being uniformly dispersed on a portion where the dispersion film 17a was formed on the transparent substrate 11. As a result, the dispersion film composed of the metal nanowires 13 is formed. After that, an adsorption treatment may be performed by contacting the treatment solution 25 in which the colored compound a is dissolved with the dispersion film in a procedure similar to the above-mentioned procedure.

<Effects of Second Embodiment>

According to the manufacturing method of the second embodiment described above, the transparent conductive film 1 having a structure in which the colored compound a is adsorbed by the metal nanowires 13 themselves can be manufactured at low cost by a simple method without using a vacuum process.

«8. Third Embodiment (Manufacturing Method of a Transparent Conductive Film in which Film Formation is Performed after Adsorption of a Colored Compound)»

Figure 6:
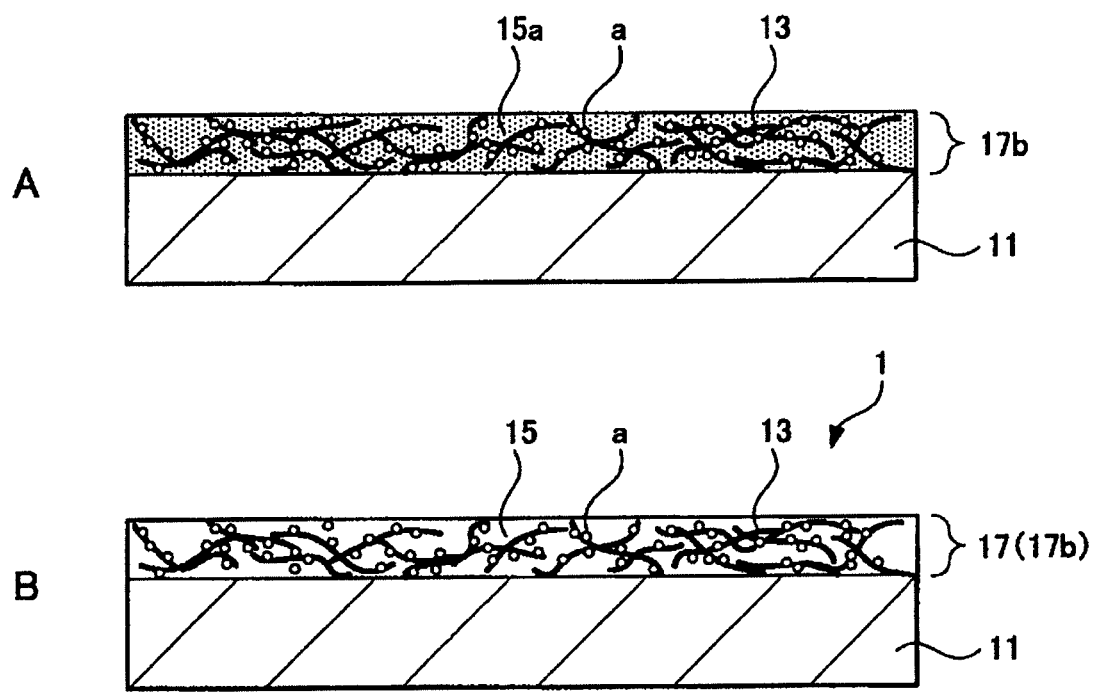
FIG. 6A and FIG. 6B each are a process view showing a manufacturing method of a transparent conductive film according to a third embodiment.

Next, with reference to FIG. 6, a method of forming a dispersion film of metal nanowires after a colored compound is adsorbed by the metal nanowires will be described as a second example of the manufacturing method of a transparent conductive film. The redundant description on the procedure similar to that according to the second embodiment described with reference to FIG. 5 is omitted.

[Preparation of Dispersion Liquid]

A dispersion liquid in which metal nanowires are dispersed in a solvent is prepared. The dispersion liquid prepared here is different from the dispersion liquid prepared in the first example in that the colored compound is added. A structure other than this is similar to that in the first example. By preparing such a dispersion liquid, the colored compound is allowed to be bound to the metal constituting the metal nanowires in the dispersion liquid, so that the colored compound is previously adsorbed by the metal nanowire.

The amount of the colored compound to be added in the dispersion liquid is preferably large in order to increase an effect of reducing the reflection L value. However, when the amount of the colored compound to be added in the dispersion liquid is extremely large, the metal nanowires tend to aggregate in the dispersion liquid, causing deterioration of the sheet resistance value and total light transmittance of the manufactured transparent conductive film. For this reason, the amount of the colored compound to be added in the dispersion liquid is preferably 0.0001 to 0.1% by weight.

[Formation of Dispersion Film]

Next, as shown in FIG. 6A, a dispersion film 17b is formed on a transparent substrate 11, with the dispersion liquid containing the colored compound a prepared as described above. This dispersion film 17b is a film which includes the metal nanowires 13 allowed to adsorb the colored compound a and dispersed in the solvent, and which also contains an uncured transparent resin material 15a. A method of forming the dispersion film 17b is not limited, and an immersion method or a coating method similar to the method according to the first example described with reference to FIG. 5 is applied.

[Drying and Curing of Dispersion Film]

Next, as shown in FIG. 6B, the solvent in the dispersion film 17b formed on the transparent substrate 11 is dried and then removed. Thereafter, a curing treatment of an uncured transparent resin material (15a) is performed, thereby forming an adsorption wire layer 17 in which the metal nanowires 13 allowed to adsorb the colored compound a are dispersed in a cured transparent resin material 15. The removal of the solvent by drying, and the curing treatment of the uncured transparent resin material described above are performed by a method similar to that described in the first example. Thereafter, to reduce the sheet resistance value of the obtained transparent conductive film, a pressurizing treatment with a calendar is performed as necessary, in a manner similar to the first example.

Thus, the manufacturing of the transparent conductive film 1 is completed.

[Regarding Patterning]

When the manufacturing method according to the present third embodiment is applied to prepare a transparent conductive film having an electrode pattern including the adsorption wire layer 17, the previously patterned dispersion film 17b may be formed in the process of forming the dispersion film 17b described with reference to FIG. 6A. Pattern formation of the dispersion film 17b may be performed by, for example, a printing method. As another method, the dispersion film 17b (adsorption wire layer 17) may be subjected to pattern etching in a process after the dispersion film 17b formed in FIG. 6A has been cured. In this case, the pattern etching may be performed at least so that the metal nanowires 13 are divided and put in an insulated state, in a region other than an electrode pattern in the dispersion film 17b (adsorption wire layer 17).

[Others]

When preparing the transparent conductive film 1-1 in which the overcoat layer 21 is provided on the top of the adsorption wire layer 17, as in the modification 1 described with reference to FIG. 2, a process of further forming the overcoat layer 21 on the top of the adsorption wire layer 17 may be performed. Furthermore, when preparing the transparent conductive film 1-2 in which the anchor layer 23 is provided between the transparent substrate 11 and the adsorption wire layer 17, as in the modification 2 described with reference to FIG. 3, the anchor layer 23 is formed on the transparent substrate 11 prior to the formation of the dispersion film 17b. Thereafter, a process of forming the dispersion film 17b on the anchor layer 23 and the subsequent process thereto may be performed.

Furthermore, when preparing the adsorption wire layer 17' configured without using the transparent resin material, as in the modification 3 described with reference to FIG. 4, the dispersion liquid constituting the dispersion film 17b is formed without using the transparent resin material. Accordingly, when the solvent is removed from the dispersion film 17b formed on the transparent substrate 11, the metal nanowires 13 allowed to adsorb the colored compound a are left in a state of being cumulated on the transparent substrate 11. In this state, the dispersion wire layer 17' in which the metal nanowires 13 allowed to adsorb the colored compound a are cumulated in a state of being uniformly dispersed in a portion where the dispersion film 17b was formed on the transparent substrate 11.

<Effects of Third Embodiment>

Even in the manufacturing method of the third embodiment described above, the transparent conductive film 1 having a structure in which the colored compound a is adsorbed to the metal nanowires 13 themselves can be manufactured at low cost by a simple method without using a vacuum process, in a manner similar to the manufacturing method according to the second embodiment. Furthermore, particularly in the manufacturing method according to the present third embodiment, the manufacturing procedures are fewer as compared to those in the manufacturing method according to the second embodiment, and the transparent conductive film 1 can be obtained more simply.

«9. Fourth Embodiment (Structural Example of an Information Input Device Using Transparent Conductive Films)»

Figure 7:
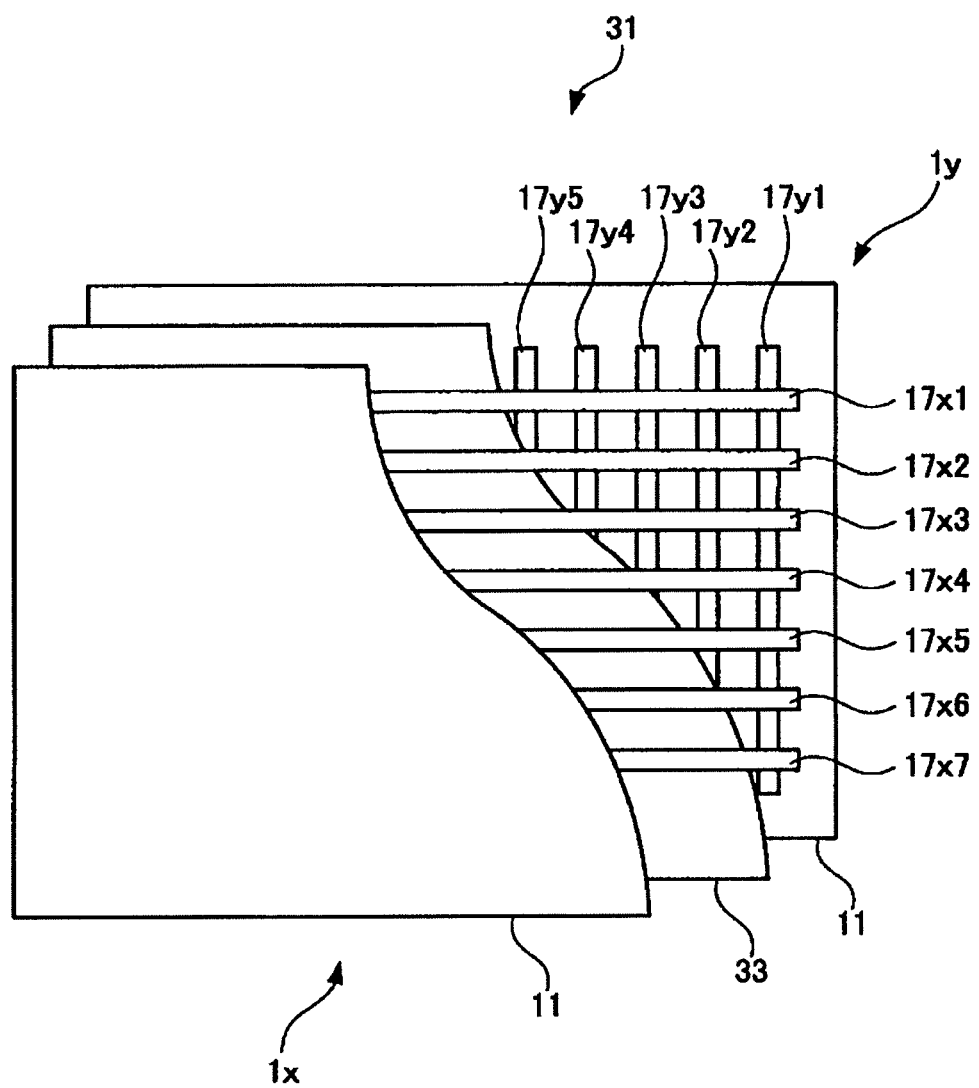
FIG. 7 is a main part structural view of an information input device according to a fourth embodiment.

FIG. 7 shows a main part structural view of an information input device using transparent conductive films. The information input device 31 shown in this drawing is, for example, a capacitive touch panel arranged on a display surface of a display panel, and configured by using two transparent conductive films 1x and 1y. The transparent conductive films 1x and 1y includes electrode patterns 17x1, 17x2, . . . and 17y1, 17y2, . . . arranged in parallel on the respective transparent substrates 11, respectively. The electrode patterns each include the adsorption wire layer described in the first embodiment and the modifications 1 to 3. These transparent conductive films 1x and 1y are bonded together via an adhesive insulating film 33 so that the electrode patterns 17x1, 17x2, . . . and the electrode patterns 17y1, 17y2, . . . are opposed to each other in a state of being orthogonal to each other in the x-y direction.

Furthermore, although not shown in the drawings, this information input device 31 includes a plurality of terminals wired thereto. The terminals separately apply a measurement voltage to each of the electrode patterns 17x1, 17x2, . . . and 17y1, 17y2, . . . of the transparent conductive films 1x and 1y.

The information input device 31 alternately applies a measurement voltage to the electrode patterns 17x1, 17x2, . . . provided to the transparent conductive film 1x and the electrode patterns 17y1, 17y2, provided to the transparent conductive film 1y. When the surface of the transparent substrate 11 is contacted by a finger or a touch pen in this state, the capacity of each part existing in the information input device 31 changes. As a result, the measurement voltage of each of the electrode patterns 17x1, 17x2, . . . and 17y1, 17y2, . . . changes. This change varies depending on the distance from the position contacted by a finger or a touch pen, and is largest at the position contacted by a finger or a touch pen. For this reason, the position addressed by the electrode patterns 17xn and 17yn, in which the change of the measurement voltage becomes largest, is detected as a position touched by a finger or a touch pen.

<Effects of Fourth Embodiment>

In the information input device 31 according to the fourth embodiment described above, the adsorption wire layers 17 and 17' inhibiting diffused reflection of light, described in the first embodiment or the modifications 1 to 3 thereof, are used as electrode patterns 17x1, 17x2, . . . and 17y1, 17y2, . . . . Accordingly, the patterned electrode patterns 17x1, 17x2, . . . and 17y1, 17y2, . . . can be prevented from being visually recognized by diffused reflection of outside light. Furthermore, when the information input device 31 is arranged on the display surface of the display panel, a display in which black floating in a black display state is prevented is enabled. The black floating is caused by diffused reflection of outside light on the electrode patterns 17x1, 17x2, and 17y1, 17y2, . . . provided in the information input device 31.

The information input device according to the present disclosure is not limited to the information input device 31 described herein, and can be widely applied to an information input device configured by including the transparent conductive film. For example, the information input device may be a resistive touch panel. Even with such a structure, the effects similar to those of the information input device 31 according to the fourth embodiment can be obtained.

«10. Fifth Embodiment (Structural Example of a Display Device Provided with an Information Input Device)»

Figure 8:
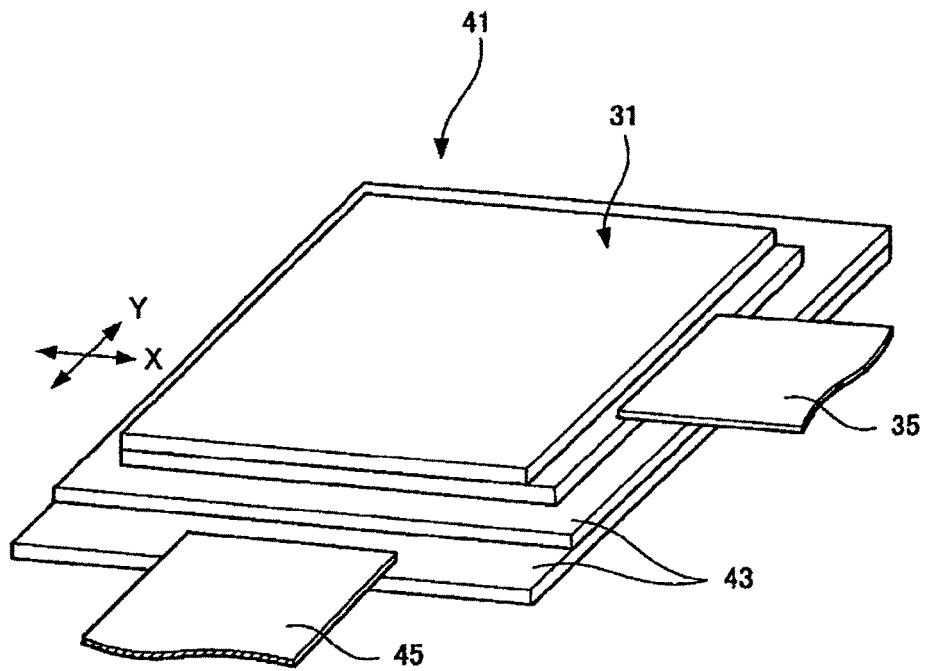
FIG. 8 is a perspective view illustrating a structure of a display device (being an electronic device) provided with an information input device according to a fifth embodiment.

FIG. 8 shows a perspective view of a display device including an information input device, as an example of the electronic device of the present disclosure. The display device 41 shown in this drawing includes, for example, the information input device 31 configured as described in the fourth embodiment arranged on a display surface of a display panel 43.

The display panel 43 is, for example, a liquid crystal display panel which may be any of a reflection type, a transmission type, and a semi-transmission and reflection type. A deflecting plate is provided at least on the display surface side. Furthermore, a flexible printed circuit board 45 is connected to this display panel 43, so that a signal of a display image is input.

The information input device 31 is arranged in an overlapping manner on the display surface for an image in the display panel 43 in a state of covering the display surface. A flexible printed circuit board 35 is connected to this information input device 31. The above-mentioned measurement voltage is applied to each of the electrode patterns 17x1, 17x2, . . . and 17y1, 17y2, . . . in the information input device 31 from the flexible printed circuit board 35.

Thus, a user can contact a part of the display image displayed in the display panel 43 with a finger or a touch pen, so that the positional information of the contacted portion can be input to the information input device 31.

<Effects of Fifth Embodiment>

The display device 41 according to the fifth embodiment described above includes the information input device 31 configured as described in the fourth embodiment and arranged on the display surface of the display panel 3. Therefore, even if the display of the display panel 43 is a black display, black floating caused by diffused reflection of outside light on the surfaces of the electrode patterns 17x1, 17x2, . . . and 17y1, 17y2, . . . constituting the information input device 31 is prevented, and a high contrast display is made possible even with the information input device 31.

In the fifth embodiment, the display panel 43 is exemplified by a liquid crystal display panel. However, the display panel 43 is not limited to this. Almost all display panels, such as an organic EL display device and a plasma display panel, can be applied, and exert the similar effects.

«11. Sixth Embodiment (Structural Example of a Display Device Using a Transparent Conductive Film)»

Figure 9:
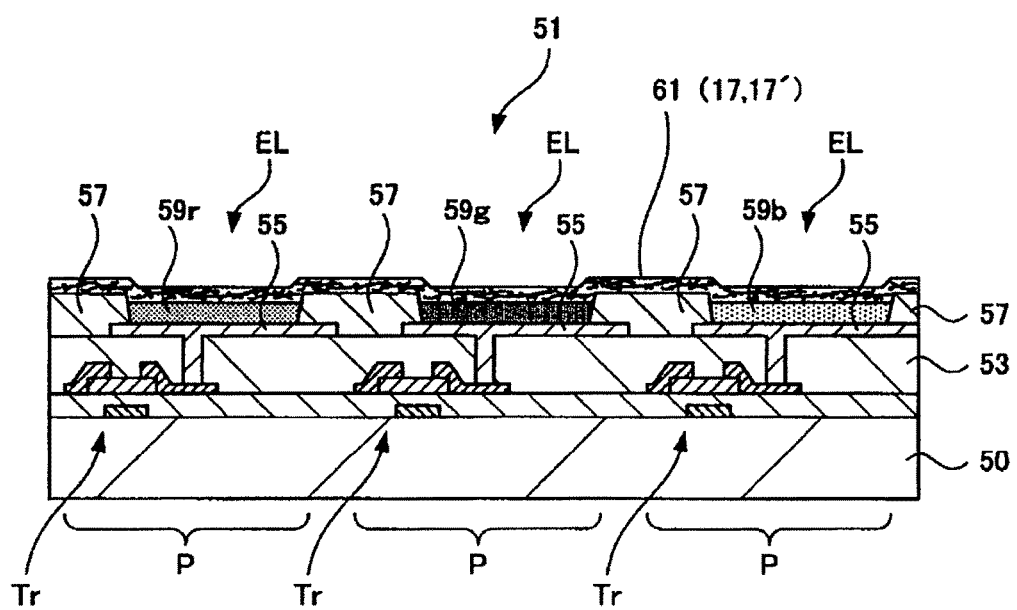
FIG. 9 is a main part cross-sectional view of a display device (being an electronic device) using a transparent conductive film according to a sixth embodiment.

FIG. 9 shows a main part cross-sectional view of a display device using a transparent conductive film. A display device 51 shown in this drawing is an active matrix-type organic EL display device using an organic electroluminescent element EL.

As shown in this drawing, the display device 51 is an active matrix-type display device 51 in which a pixel circuit using a thin film transistor Tr and an organic electroluminescent element EL connected to the pixel circuit are arranged in each pixel P on a substrate 50.

The top of the substrate 50 on which the thin film transistors Tr are arranged is covered with a planarization insulating film 53. On the top of this planarization insulating film 53, a pixel electrode 55 connected to the thin film transistor Tr via a connection pore provided in the planarization insulating film 53 is arranged and formed. The pixel electrode 55 constitutes a positive electrode (or a negative electrode).

The peripheral border of each pixel electrode 55 is covered with a window insulating film 57, thereby being element-separated. The top of the element-separated pixel electrode 55 is covered with an organic luminescence function layer of each color 59r, 59g, or 59b. Furthermore, a common electrode 61 covering these organic luminescence function layers is provided. Each organic luminescence function layer 59r, 59g, or 59b has a layered structure having at least an organic luminescent layer. A layer, which contacts each organic luminescent function layer 59r, 59g, or 59b, in the common electrode 61 covering the organic luminescence function layers, is formed as, for example, a negative electrode (or a positive electrode). The common electrode 61 is formed, as a whole, as a light transmitting electrode which takes out the luminescent light generated in each of the organic luminescent function layers 59r, 59g, and 59b. A transparent electrode including the adsorption wire layers 17 and 17' described in the first embodiment and the modifications 1 to 3 thereof is used in at least part of the layers of the common electrode 61.

Thus, the organic electroluminescent element EL is formed in each pixel P part in which the organic luminescence function layer 59*r*, 59*g*, or 59*b* is arranged between the pixel electrode 55 and the common electrode 61. Although not shown in the drawing, a protective layer is further provided on the substrate 50 on which these organic electroluminescent elements EL are formed, and a sealing substrate is bonded on the protective layer via an adhesive agent, thereby constituting the display device 51.

<Effects of Sixth Embodiment>

In the display device 51 according to the sixth embodiment described above, the adsorption wire layers (transparent electrode films) 17 and 17' described in the first embodiment and the modifications 1 to 3 thereof are used as a common electrode 61 provided on the display surface side that is a side of taking out the luminescent light. Thus, when the luminescent light generated in each of the organic luminescence function layers 59*r*, 59*g*, and 59*b* is taken out from the common electrode 61 side, black floating caused by diffused reflection of outside light is prevented, and a high contrast display is made possible even in an outside light environment.

Here, the information input device 31 may be arranged on the display surface side of this display device 51 similarly to the fifth embodiment. Even in this case, the effects similar to those in the fifth embodiment can be obtained.

«12. Seventh Embodiment (Structural Example of an Electronic Device Provided with a Display Part)»

FIGS. 10 to 14 each show an example of an electronic device which has, in its display part, the display device provided with the information input device according to the fifth embodiment described with reference to FIG. 8 or the display device according to the sixth embodiment described with reference to FIG. 9. Application examples of the electronic device according to the present disclosure will be described below.

Figure 10:
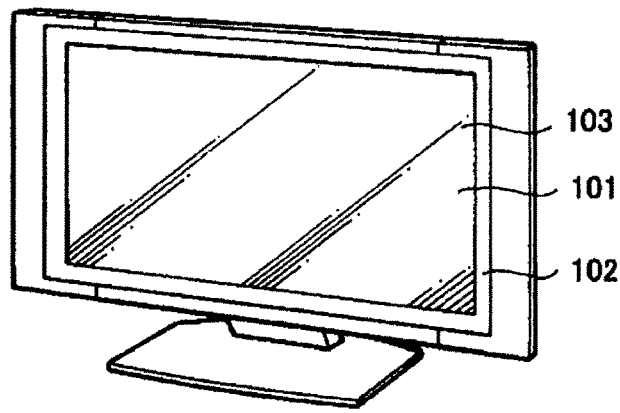
FIG. 10 is a perspective view showing a TV set (being an electronic device) provided with a display part according to a seventh embodiment.

FIG. 10 is a perspective view showing a TV set to which the present disclosure is applied. A TV set 100 according to the present application example includes a display part 101 having a front panel 102, a filter glass 103, and the like. As the display part 101, the display device previously described is applied.

Figure 11:
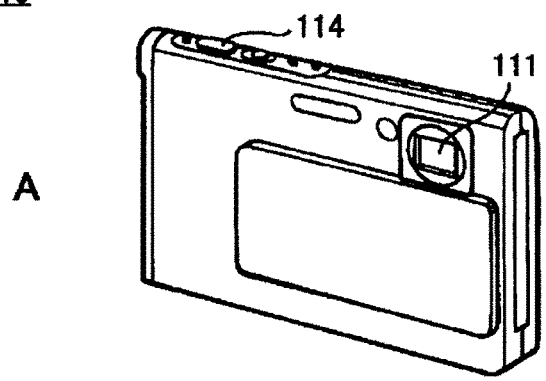
FIG. 11A and FIG. 11B each are a perspective view showing a digital camera (being an electronic device) provided with the display part according to the seventh embodiment.
Figure 11:
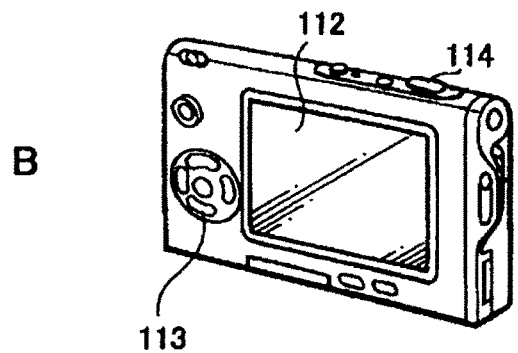

FIG. 11 is a view showing a digital camera to which the present disclosure is applied. FIG. 11A is a perspective view seen from the front side, and FIG. 11B is a perspective view seen from the back side. A digital camera 110 according to the present application example includes a luminescence part 111 for flash, a display part 112, a menu switch 113, a shutter button 114, and the like. As the display part 112, the display device previously described is applied.

Figure 12:
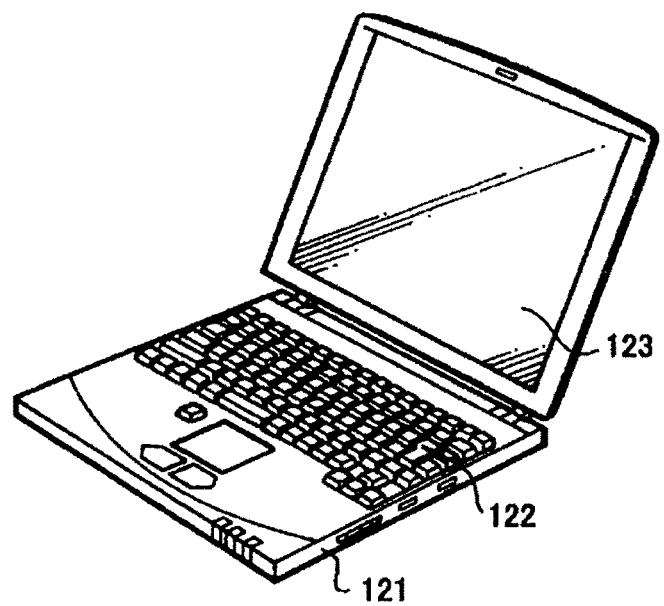
FIG. 12 is a perspective view showing a notebook personal computer (being an electronic device) provided with the display part according to the seventh embodiment.

FIG. 12 is a perspective view showing a notebook personal computer to which the present disclosure is applied. A notebook personal computer 120 according to the present application example includes a keyboard 122 that is operated when inputting a letter or the like, a display part 123 that displays an image, and the like in a body 121. As the display part 123, the display device previously described is applied.

Figure 13:
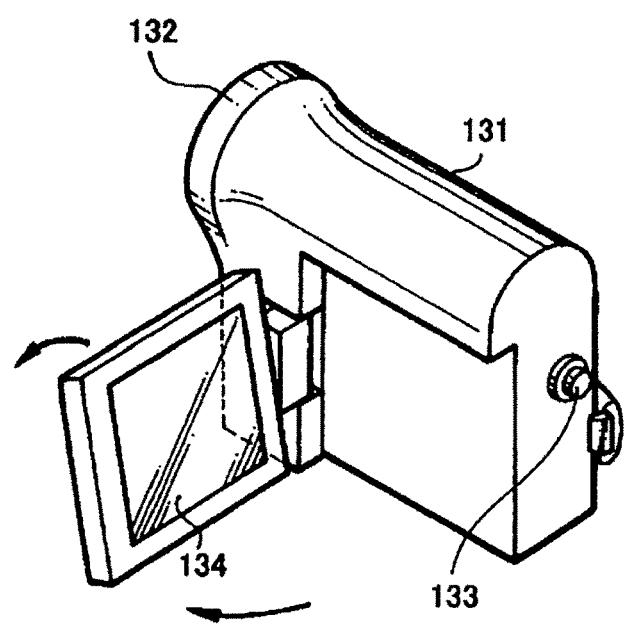
FIG. 13 is a perspective view showing a video camera (being an electronic device) provided with the display part according to the seventh embodiment.

FIG. 13 is a perspective view showing a video camera to which the present disclosure is applied. A video camera 130 according to the present application example includes a body part 131, a lens 132 for subject photography and provided on the side facing the front, a start/stop switch 133 for taking pictures, a display part 134, and the like. As the display part 134, the display device previously described is applied.

Figure 14:
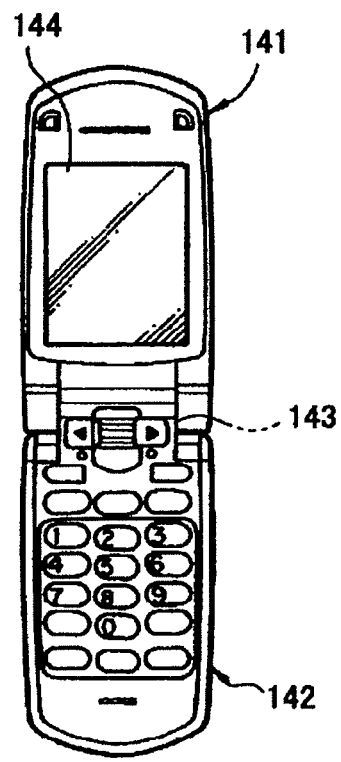
FIG. 14 is a front view of a mobile terminal device (being an electronic device) provided with the display part according to the seventh embodiment.

FIG. 14 is a front view showing a mobile terminal device, for example, a mobile phone, to which the present disclosure is applied. A mobile phone 140 according to the present application example includes an upper side casing 141, a lower side casing 142, a linking part (a hinge part in this case) 143, and a display part 144. As the display part 144, the display device previously described is applied.

Even in the case of each of the electronic devices as above, a high contrast display is made possible even in an outside light environment, by using the display device according to the fifth embodiment or the sixth embodiment in the display part.

EXAMPLES

Examples 1 to 4

By applying the procedure according to the second embodiment described with reference to FIG. 5, the transparent conductive films of Examples 1 to 4 were prepared as below (see Table 1 shown below).

First, silver nanowires were prepared as metal nanowires. Here, in accordance with the existing method referring to a literature ("ACS Nano" 2010, Vol. 4, No. 5, p. 2955-2963), silver nanowires each having a diameter of 30 nm and a length of 10 µm [Ag(1) in Table 1] were prepared.

Next, the following materials were placed in ethanol together with the prepared silver nanowires, and the silver nanowires were dispersed in ethanol using ultrasonic waves, thereby to prepare a dispersion liquid.

Silver nanowires [Ag(1)]: 0.28% by weight

Hydroxypropyl methyl cellulose (being a transparent resin material) manufactured by Aldrich: 0.83% by weight Duranate D101 (being a resin curing agent) manufactured by Asahi Kasei: 0.083% by weight Neostan U100 (being a cure promoting catalyst) manufactured by Nitto Kasei: 0.0025% by weight Ethanol (being a solvent): 98.8045% by weight The prepared dispersion liquid was coated on a transparent substrate using a count 8 coil bar to form a dispersion film. The coating weight of the silver nanowires was about 0.05 g/m$^2$. As a transparent substrate, a PET (O300E manufactured by Mitsubishi Plastics Inc.) having a thickness of 125 µm was used. Next, a heating treatment at 85° C. for 2 minutes was performed in the atmosphere to dry and remove the solvent in the dispersion film. Subsequently, a heating treatment at 150° C. for 30 minutes was further performed in the atmosphere to cure the transparent resin material in the dispersion film.

Next, a black dye (Kayakalan Black 2RL manufactured by Nippon Kayaku Co., Ltd.) as a colored compound was dissolved in dimethyl sulfoxide at 0.25% by weight, thereby preparing a treatment solution containing a colored compound. The dispersion film of the silver nanowires was immersed in the treatment solution of the colored compound heated to 85° C., and an adsorption treatment for adsorbing the colored compound in the treatment solution to the silver nanowires in the dispersion film was performed. Thus, a transparent conductive film was obtained. The adsorption treatment time (immersion time) was set at 10 minutes in Example 1, at 7.5 minutes in Example 2, at 5.0 minutes in Example 3, and at 2.5 minutes in Example 4. In this case, the colored compound has a sulfo group as a functional group [X].

Example 5

A transparent conductive film was prepared in the procedure similar to the procedures according to Examples 1 to 4 described above, except that a black dye (Kayakalan Black BGL manufactured by Nippon Kayaku Co., Ltd.) was used as a colored compound and that the adsorption treatment time (immersion time) was set at 2 minutes. In this case, this colored compound has a sulfo group as a functional group [X].

Examples 6 to 9

A transparent conductive film was prepared in a procedure similar to the procedures according to Examples 1 to 4 described above, except that a compound of each color was used as a colored compound and that the adsorption treatment time (immersion time) was set at 10 minutes.

The compound for each color used was Kayarus Cupro Green G manufactured by Nippon Kayaku Co., Ltd. in Example 6, Kayarus Supra Blue MRG manufactured by Nippon Kayaku Co., Ltd. in Example 7, Kayarus Supra Scarlet BNL200 manufactured by Nippon Kayaku Co., Ltd. in Example 8, and Lanyl Olive BG50% manufactured by Taoka Chemical Company, Limited in Example 9. In this case, each of these compounds of each color has a sulfo group as a functional group [X].

Example 10

A transparent conductive film was prepared in a procedure similar to the procedures according to Examples 1 to 4, except that an IPA dispersion liquid of silver nanowires (trade name: SLV-NW-60, 60 nm in diameter) manufactured by Blue Nano Inc. as metal nanowires was used and that the adsorption treatment time (immersion time) was set at 10 minutes.

Silver nanowires [Ag(2)]: 0.28% by weight
Hydroxypropyl methyl cellulose (being a transparent resin material) manufactured by Aldrich: 0.83% by weight
Duranate D101 (being a resin curing agent) manufactured by Asahi Kasei: 0.083% by weight
Neostan U100 (being a cure promoting catalyst) manufactured by Nitto Kasei: 0.0025% by weight
Ethanol+IPA (being a solvent): 98.8045% by weight Example 11

By applying the procedure according to the third embodiment described with reference to FIG. 6, a transparent conductive film according to Example 11 to which the modification 3 in FIG. 4 is applied was prepared as below.

Using the IPA dispersion liquid of silver nanowires similar to that used in Example 10, a dispersion liquid containing a colored compound together with the silver nanowires [Ag(2)] was prepared. The composition of the dispersion liquid is as follows.

Silver nanowires [Ag(2)]: 0.28% by weight
Kayakalan Black BGL (being a colored compound) manufactured by Nippon Kayaku Co., Ltd.: 0.0016% by weight
PVP K-30 (being a dispersant) manufactured by Junsei Chemical Co., Ltd.: 0.2% by weight
Ethanol+IPA (being a solvent): 99.5184% by weight The prepared dispersion liquid was coated on a transparent substrate using a count 8 coil bar to form a dispersion film. The coating weight of the silver nanowires was about 0.05 g/m$^2$. As a transparent substrate, a PET (O300E manufactured by Mitsubishi Plastics Inc.) having a thickness of 125 μm was used. Next, a heating treatment at 85° C. for 2 minutes in the atmosphere was performed to dry and remove the solvent in the dispersion film. Accordingly, a transparent conductive film, in which the silver nanowires allowed to adsorb the colored compound were cumulated on the transparent substrate without being dispersed in a transparent resin material, was prepared.

Example 12

A transparent conductive film was prepared in a procedure similar to the procedures according to Examples 1 to 4 described above, except that a compound having a carboxyl group (D358 manufactured by Mitsubishi Paper Mills, Ltd.) was used as a colored compound and that the adsorption treatment time (immersion time) was set at 20 minutes.

Comparative Example 1

A transparent conductive film was prepared in a procedure similar to the procedures according to Examples 1 to 4 described above, except that a colorless dodecylbenzenesulfonic acid (DES: functional group—sulfo group) was used in place of a colored compound and that the adsorption treatment time (immersion time) was set at 10 minutes.

Comparative Example 2

A procedure similar to that according to Example 1 was performed until a transparent resin material in a dispersion film was cured, and an adsorption treatment was not performed. Thus, a transparent conductive film without containing a colored compound was prepared.

Comparative Example 3

A procedure similar to that according to Example 10 was performed until a transparent resin material in a dispersion film was cured, and an adsorption treatment was not performed. Thus, a transparent conductive film without containing a colored compound was prepared.

Comparative Example 4

A transparent conductive film was prepared in a procedure similar to the procedures according to Examples 1 to 4 described above, except that a colorless dodecanoic acid (DA: functional group—carboxyl group) was used in place of a colored compound and that the adsorption treatment time (immersion time) was set at 10 minutes.

Comparative Example 5

A transparent conductive film was prepared in a procedure similar to the procedures according to Examples 1 to 4 described above, except that a colorless dodecylphosphonic acid (DPA: functional group—phosphate group) was used in place of a colored compound and that the adsorption treatment time (immersion time) was set at 10 minutes.

«Evaluation-1»

With respect to the transparent conductive films prepared in the above Examples 1 to 12 and Comparative Examples 1 to 5, A) total light transmittance, B) black floating, C) sheet resistance value [Ω/□], and D) reflection L value were evaluated. Each evaluation was performed as follows.

<A) Evaluation of Total Light Transmittance>

The evaluation was performed using HM-150 (trade name; manufactured by Murakami Color Research Laboratory) in accordance with JIS K7136.

<C) Evaluation of Sheet Resistance Value>

The evaluation was performed using MCP-T360 (trade name; manufactured by Mitsubishi Chemical Analytech Co., Ltd.).

<D) Evaluation of Reflection L Value>

A reflection L value was evaluated with the samples used in evaluating black floating, in accordance with JIS Z8722 using Color i5 manufactured by X-Rite, Incorporated.

The result of each evaluation is shown in Table 1 below.

TABLE 1

|  | Metal Nanowire | Colored Compound | Functional Group | Adsorption Treatment Time | A) Total Light Transmittance [%] | B) Black Floating | C) Sheet Resistance Value [Ω/□] | D) Reflection L Value |
|---|---|---|---|---|---|---|---|---|
| Example 1 | Ag(1) | Kayakalan Black 2RL | Sulfo Group | 10.0 min. | 90.6 | A | 180 | 7.88 |
| Example 2 |  |  |  | 7.5 min. | 90.6 | A | 160 | 7.98 |
| Example 3 |  |  |  | 5.0 min. | 90.5 | B | 150 | 8.72 |
| Example 4 |  |  |  | 2.5 min. | 90.4 | B | 110 | 9.10 |
| Example 5 |  | Kayakalan Black BGL |  | 2.0 min. | 90.5 | A | 160 | 7.70 |
| Example 6 |  | Kayarus Cupro Green G |  | 10.0 min. | 90.7 | A | 150 | 8.29 |
| Example 7 |  | Kayarus Supra Blue MRG |  |  | 90.6 | A | 160 | 8.54 |
| Example 8 |  | Kayarus Supra Scarlet BNL200 |  |  | 90.4 | A | 170 | 8.53 |
| Example 9 |  | Lanyl Olive GB 50% |  |  | 90.8 | A | 180 | 8.11 |
| Example 10 | Ag(2) | Kayakalan Black 2RL |  |  | 86.5 | A | 190 | 14.03 |
| Example 11 |  | Kayakalan Black BGL |  | Initial Mixing | 87.1 | A | 160 | 13.67 |
| Example 12 | Ag(1) | D358 | Carboxyl Group | 20.0 min. | 90.6 | A | 100 | 8.56 |
| Comparative Example 1 | Ag(1) | DBS (Colorless Compound) | Sulfo Group | 10.0 min. | 90.4 | C | 170 | 9.26 |
| Comparative Example 2 | — | — | — | — | 90.4 | — | 100 | 9.50 |
| Comparative Example 3 | Ag(2) | — | — | — | 85.0 | — | 100 | 15.75 |
| Comparative Example 4 | Ag(1) | DA (Colorless Compound) | Carboxyl Group | 10.0 min. | 90.4 | C | 100 | 9.22 |
| Comparative Example 5 |  | DPA (Colorless Compound) | Phosphate Group |  | 90.4 | C | 130 | 9.25 |

<B) Evaluation of Black Floating>

With respect to Examples 1 to 10 and 12 and Comparative Examples 1, 4, and 5, a portion (untreated part) in which an adsorption treatment is not performed was formed adjacent to a portion (treated part) in which an adsorption treatment was performed. A visual inspection was performed from the transparent substrate side in a state of bonding a black tape on the dispersion film (wire layer) side on which the treated part and the untreated part were formed, and occurrence of black floating was evaluated into three levels of A (good), B (moderate), and C (poor) as follows.

A: Boundary between the treated part and the untreated part can be easily determined, and black floating in the treated part is reduced.

B: Boundary between the treated part and the untreated part is difficult to be recognized, but black floating in the treated part is reduced.

C: Boundary between the treated part and the untreated part is not recognized, and black floating in the treated part occurs.

Comparative Example 2 is comparable to the untreated part of Examples 1 to 9; and Comparative Example 3 is comparable to the untreated part of Example 10. That is, the three level evaluation with respect to Examples 1 to 9 and 12 and Comparative Examples 1, 2, 4, and 5 are based on Comparative Example 2; and the three level evaluation with respect to Examples 10 and 11 are based on Comparative Example 3.

From the results shown in Table 1, the following was confirmed.

First, in all of Examples 1 to 12 in which an adsorption treatment was performed, A) total light transmittance did not deteriorate. Therefore, it was confirmed that the colored compound is adsorbed only to the silver nanowires. When the colored compound is also adsorbed by the transparent substrate or the transparent resin material, A) total light transmittance deteriorates. For this reason, it is suggested that the colored compound is directly bound to the silver nanowire, or to the dispersant such as PVP existing on the surface of the silver nanowire, via a functional group [X].

From the results of B) black floating with respect to Examples 1 to 4, it was confirmed that when the same colored compound is used, a longer adsorption treatment time increases the reduction effect of B) black floating and the adsorption amount of the colored compound.

From comparison between the results of B) black floating of Examples 1 to 4 and Example 5 in which different black dyes were used as a colored compound, it was confirmed that in order to obtain the reduction effect of the black floating, the adsorption treatment time suitable for each colored compound is preferably set.

Furthermore, in Examples 1 and 6 to 9 in which the colored compound for each color was used and the adsorption treatment time was commonly set at 10 minutes, a high reduction effect of black floating was obtained in a similar manner. Therefore, it was confirmed that the color of the colored compound is not limited. In this case, as described above, the adsorption treatment time is preferably set in an appropriate manner for each colored compound.

Furthermore, the high reduction effect of black floating was obtained even in Example 11 in which the dispersion film was formed after the silver nanowires were allowed to adsorb the colored compound by initial mixing. Thus, it was confirmed that the procedure of adsorbing the colored compound to the silver nanowires is not limited.

Furthermore, in Comparative Examples 1, 4, and 5 in which a colorless compound was adsorbed, the reduction effect of black floating was not obtained. Therefore, it was confirmed that a compound to be adsorbed by the metal nanowire has to be a colored compound.

Furthermore, from the result of Examples 1 to 4, it was found that a longer adsorption treatment time increases not only C) sheet resistance value, but also reduction effect of B) black floating. Thus, it was confirmed that lowering the adsorption amount of the colored compound as long as black floating can be prevented can lower a sheet resistance value as well.

On the other hand, in Example 12 and Comparative Example 4, it was confirmed that sheet resistance does not increase. In Comparative Example 5, increase of the sheet resistance was suppressed to be low. Thus, it was confirmed that a sheet resistance value can be lowered by selecting the kind of the functional group [X]. It is considered that this is because the adsorption form of the colored compound to the surface of the silver nanowire varies depending on the kind of the functional group [X]. Therefore, in order to inhibit the increase in the sheet resistance, the functional group [X] is preferably a carboxyl group and a phosphate group, and particularly preferably a carboxyl group.

From the evaluation results of A) total light transmittance with respect to Examples 1 to 9 and 12 and Comparative Example 2, it is understood that coating the metal wires with the colored compound can maintain or improve the transparency of the transparent conductive film. From the evaluation results of A) total light transmittance with respect to Examples 10 and 11 and Comparative Example 3, it is also understood that coating the metal wires with the colored compound can maintain or improve transparency of the transparent conductive film. It is considered that since the colored compound a coats the surface of the metal nanowire at a single-molecule level, such a superior transparency can be obtained. Besides, in order to improve transparency of the transparent conductive film, the colored compound preferably has, as a chromophoric group [R], a Cr complex, a Cu complex, an azo group, an indoline group, and a compound containing the same.

«Evaluation-2»

An environmental test was performed in which the transparent conductive film prepared in Example 1 was stored for a certain period in a dry atmosphere at 85° C. and in a 90% humidity atmosphere at 60° C., to evaluate whether B) black floating and C) sheet resistance value (Ω/□) of the transparent conductive film after the test have changed or not.

The results of the evaluation are shown in Table 2 below.

TABLE 2

| Environmental Test | After 300 Hours | |
|---|---|---|
| | B) Black Floating | C) Sheet Resistance Value |
| 85° C. | Not Changed | Not Changed |
| 60° C.: 90% | Not Changed | Not Changed |

From the result shown in Table 2, it was confirmed that properties such as B) black floating and C) sheet resistance value have not changed before and after the environmental test, and that the effects obtained by adsorbing the colored compound by the silver nanowires is permanent.

The present disclosure can also be structured as follows.
(1) A transparent conductive film, including:
  metal nanowires, and
  a colored compound adsorbed by the metal nanowires.
(2) The transparent conductive film according to (1), wherein the colored compound absorbs light in a visible light region.
(3) The transparent conductive film according to (1) or (2), wherein the colored compound has a functional group which is bound to a metal constituting the metal nanowires.
(4) The transparent conductive film according to any of (1) to (3), wherein the metal nanowires allowed to adsorb the colored compound are dispersed in a transparent resin material.
(5) The transparent conductive film according to any of (1) to (3), wherein the colored compound has a chromophoric group which has absorption in the visible light region and a group which is bound to a metal constituting the metal nanowires.
(6) The transparent conductive film according to any of (1) to (3), wherein the colored compound is represented by the following general formula (I),

$$R—X \quad (1)$$

where R is a chromophoric group which has absorption in a visible light region, and X is a group which is bound to a metal constituting the metal nanowires.
(7) The transparent conductive film according to any of (1) to (6), wherein a reflection L value is 8 or less.
(8) The transparent conductive film according to any of (1) to (8), further including a binder, and
  wherein the metal nanowires are dispersed in the binder.
(9) The transparent conductive film according to any of (1) to (8), wherein the metal nanowires are cumulated on a top of a transparent substrate.
(10) A dispersion liquid, including:
  metal nanowires; and
  a colored compound adsorbed by the metal nanowires.
(11) An information input device, comprising:
  a transparent substrate; and
  a transparent conductive film including metal nanowires allowed to adsorb a colored compound and provided on the transparent substrate.
(12) An electronic device, comprising:
  a display panel; and
  a transparent conductive film containing metal nanowires allowed to adsorb a colored compound and provided on a display surface side of the display panel.

Furthermore, the present disclosure can also be structured as follows.

(1) A transparent conductive film, including:
  metal nanowires each having a surface, and
  a colored compound coating at least part of the surface.
(2) The transparent conductive film according to (1), wherein the colored compound absorbs light in the visible light region.
(3) The transparent conductive film according to (1) or (2), wherein the colored compound has a functional group which is bound to a metal constituting the metal nanowires.
(4) The transparent conductive film according to any of (1) to (3), wherein the metal nanowires allowed to adsorb the colored compound are dispersed in a transparent resin material.
(5) The transparent conductive film according to any of (1) to (3), wherein the colored compound has a chromophoric group which has absorption in the visible light region and a group which is bound to a metal constituting the metal nanowires.
(6) The transparent conductive film according to any of (1) to (3), wherein the colored compound is represented by the following general formula (1), $$R-X \qquad (1)$$

where R is a chromophoric group which has absorption in the visible light region, and X is a group which is bound to a metal constituting the metal nanowire.
(7) The transparent conductive film according to any of (1) to (6), wherein a reflection L value is 8 or less.
(8) The transparent conductive film according to any of (1) to (3), further including a binder, and
  wherein the metal nanowires are dispersed in the binder.
(9) The transparent conductive film according to any of (1) to (8), wherein the metal nanowires are cumulated on a top of a transparent substrate.
(10) A dispersion liquid, including:
  metal nanowires each having a surface; and
  a colored compound coating at least part of the surface.
(11) An information input device, comprising:
  a transparent substrate; and
  a transparent conductive film including metal nanowires and provided on the transparent substrate, at least part of a surface of the metal nanowires being coated with a colored compound.
(12) An electronic device, comprising:
  a display panel, and
  a transparent conductive film including metal nanowires and provided on a display surface side of the display panel, at least part of a surface of the metal nanowires being coated with a colored compound.

REFERENCE SIGNS LIST

1, 1-1, 1-2, 1-3 . . . transparent conductive film, 11 . . . transparent substrate, 13 . . . metal nanowire, 15 . . . transparent resin material, 17, 17' . . . adsorption wire layer (transparent conductive film), 31 . . . information input device, 41 . . . display device (electronic device), 43 . . . display panel, 51 . . . display device (electronic device), a . . . colored compound

The invention claimed is:
1. A transparent conductive film comprising:
  metal nanowires; and
  a colored compound adsorbed by the metal nanowires, wherein
    the colored compound is represented by the following general formula (1),

$$R-X \qquad (1)$$

wherein R is a chromophoric group that has absorption in a visible light region in a wavelength range of 360 nm to 830nm and X is a functional group that is bound to a metal constituting the metal nanowires,
    the chromophoric group being selected from the group consisting of an unsaturated alkyl group, an aromatic ring, a heterocyclic ring, and a metal ion, and
    the functional group being a sulfo group,
    a reflection L value of the transparent conductive film is 8or less,
    the metal nanowires allowed to adsorb the colored compound are dispersed in a transparent resin material,
    the colored compound is unevenly distributed on the nanowire such that the colored compound is distributed at varied intervals along an entire length of each nanowire, and
    a sheet resistance of the film is 160 Ω/☐ or less and 100 Ω/☐ or more.
2. The transparent conductive film according to claim 1, further comprising a binder, the metal nanowires being dispersed in the binder.
3. The transparent conductive film according to claim 1, wherein
  the metal nanowires are cumulated on a top of a transparent substrate.
4. An information input device, comprising:
  a transparent substrate; and
  a transparent conductive film according to claim 1.
5. An electronic device, comprising:
  a display panel; and
  a transparent conductive film according to claim 1.
6. The transparent conductive film according to claim 1, further comprising
  an overcoat layer.
7. The transparent conductive film according to claim 1, further comprising
  a transparent substrate and an anchor layer.
8. The transparent conductive film according to claim 1, further comprising
  a transparent substrate interposed between two hard coat layers.
9. The transparent conductive film according to claim 1, wherein
  the metal nanowires do not include metal oxide.
10. A transparent conductive film comprising:
  metal nanowires dispersed in a transparent resin material; and
  a colored compound adsorbed by the metal nanowires,
  wherein the colored compound absorbs light in a visible light region in a wavelength range of 360 nm to 830 nm and has a functional group which is bound to a metal constituting the metal nanowires, and wherein a reflection L value is 8 or less,
  the functional group being a sulfo group wherein the colored compound is unevenly distributed on the nanowire such that the colored compound is distributed at varied intervals along an entire length of each nanowire, and a sheet resistance of the film is 160 Ω/☐ or less and 100 Ω/☐ or more.

11. The transparent conductive film according to claim 10, further comprising
- a binder, the metal nanowires being dispersed in the binder.

12. The transparent conductive film according to claim 10, wherein
- the metal nanowires are cumulated on a top of a transparent substrate.

13. An information input device, comprising:
- a transparent substrate; and
- a transparent conductive film according to claim 10.

14. An electronic device, comprising:
- a display panel; and
- a transparent conductive film according to claim 10.

* * * * *